US 9,370,126 B2

(12) United States Patent
Hashikura et al.

(10) Patent No.: US 9,370,126 B2
(45) Date of Patent: Jun. 14, 2016

(54) ELECTRICAL JUNCTION BOX

(71) Applicants: AUTONETWORKS TECHNOLOGIES, LTD., Yokkaichi-shi, Mie (JP); SUMITOMO WIRING SYSTEMS, LTD., Yokkaichi-shi, Mie (JP); SUMITOMO ELECTRIC INDUSTRIES, LTD., Osaka-shi, Osaka (JP)

(72) Inventors: Manabu Hashikura, Yokkaichi (JP); Toshiyuki Tsuchida, Yokkaichi (JP); Shinsuke Okumi, Yokkaichi (JP)

(73) Assignees: AUTONETWORKS TECHNOLOGIES, LTD., Mie (JP); SUMITOMO WIRING SYSTEMS, LTD., Mie (JP); SUMITOMO ELECTRIC INDUSTRIES, LTD., Osaka (JP)

( * ) Notice: Subject to any disclaimer, the term of this patent is extended or adjusted under 35 U.S.C. 154(b) by 137 days.

(21) Appl. No.: 14/343,896

(22) PCT Filed: Sep. 26, 2012

(86) PCT No.: PCT/JP2012/074653
§ 371 (c)(1),
(2) Date: Mar. 10, 2014

(87) PCT Pub. No.: WO2013/047564
PCT Pub. Date: Apr. 4, 2013

(65) Prior Publication Data
US 2014/0218862 A1    Aug. 7, 2014

(30) Foreign Application Priority Data

Sep. 26, 2011   (JP) ................................ 2011-208905
Sep. 26, 2011   (JP) ................................ 2011-208908

(51) Int. Cl.
*H01R 12/00*     (2006.01)
*H05K 7/20*      (2006.01)
(Continued)

(52) U.S. Cl.
CPC ........ *H05K 7/20845* (2013.01); *B60R 16/0238* (2013.01); *H05K 7/026* (2013.01); *H05K 7/20518* (2013.01)

(58) Field of Classification Search
None
See application file for complete search history.

(56) References Cited

U.S. PATENT DOCUMENTS 6,270,360 B1    8/2001   Yanase
6,315,578 B1 *  11/2001  Kasai .................. H01R 9/2458
                                                       439/404

(Continued)

FOREIGN PATENT DOCUMENTS

JP    A 2000-83310    3/2000
JP    A 2000-253539   9/2000

(Continued)

OTHER PUBLICATIONS

Mar. 31, 2015 Office Action issued in Japanese Patent Application No. 2011-208905.

(Continued)

*Primary Examiner* — Courtney Smith
(74) *Attorney, Agent, or Firm* — Oliff PLC

(57) ABSTRACT

An electrical junction box includes a casing configured to be mounted in a vehicle, a start relay (a start electrical component) A housed in the casing and to which a current is supplied at least at a start of the vehicle, an operational electrical component (an operational relay, a connector, and a fuse connector) housed in the casing and to which a current is supplied at least during an operation of the vehicle, and a surrounding heat shield wall (a heat shield wall) disposed between the start relay and at least one of the operational relay, the connector, and the fuse connector that are the operational electrical components. The start relay includes a relay case (an electrical component case) and a terminal portion. The terminal portion is housed in the relay case and has a fixed contact and a movable contact.

20 Claims, 12 Drawing Sheets

(51) Int. Cl.
*B60R 16/023* (2006.01)
*H05K 7/02* (2006.01)

(56) References Cited

U.S. PATENT DOCUMENTS

| | | | | |
|---|---|---|---|---|
| 7,286,338 | B2* | 10/2007 | Yamashita | B60R 16/0238 361/622 |
| 7,529,095 | B2* | 5/2009 | Whitton | H01L 23/552 174/530 |
| 2002/0197893 | A1* | 12/2002 | Hiroyuki | H01R 9/226 439/76.2 |
| 2004/0007379 | A1* | 1/2004 | Suzuki | B60R 16/0239 174/59 |
| 2007/0279870 | A1* | 12/2007 | Sato | H01R 9/226 361/704 |
| 2010/0116570 | A1* | 5/2010 | Sugawara | B60K 1/04 180/65.1 |
| 2011/0244282 | A1* | 10/2011 | Seto | H01M 2/1077 429/82 |

FOREIGN PATENT DOCUMENTS

| | | |
|---|---|---|
| JP | A 2007-228691 | 9/2007 |
| JP | A 2010-108661 | 5/2010 |
| JP | A 2011-181798 | 9/2011 |

OTHER PUBLICATIONS

Jun. 30, 2015 Office Action issued in Chinese Patent Application No. 201280046698.X.

Nov. 13, 2012 Search Report issued in International Patent Application No. PCT/JP2012/074653 (with translation).

Nov. 13, 2012 Written Opinion issued in International Patent Application No. PCT/JP2012/074653 (with translation).

* cited by examiner

ELECTRICAL JUNCTION BOX

TECHNICAL FIELD

The present invention relates to an electrical junction box.

BACKGROUND ART

Conventionally, in a vehicle, an electrical junction box is employed, for example, as a module that is configured to control distribution of a current that is supplied from a power source to various vehicle electrical components. The electrical junction box houses various electrical components such as a relay and a fuse in a casing thereof. Patent Document 1 discloses a known relay that is used in the electrical junction box having the above-described configuration.

RELATED ART DOCUMENT

Patent Document

Patent Document 1: Japanese Unexamined Patent Publication No. 2010-108661

SUMMARY OF INVENTION

Problem to be Solved by the Invention

The relay described in Patent Document 1 includes an electrical component case, a terminal portion housed in the electrical component case, a coil connected to the terminal portion, and a metal plate that is exposed to an inside and an outside of the electrical component case, in addition to the terminal portion. In this configuration, moisture in the electrical component case can be actively condensed on the metal plate by heat generated by the coil when an environmental temperature decreases. Accordingly, condensation on a contact of the terminal portion is less likely to occur, and thus poor conduction at the contact, which may be caused by frozen condensation, hardly occurs.

However, the technology described in Patent Document 1 is made to prevent the poor conduction, which may be caused by the freezing, at the contact of the relay itself. The technology in Patent Document 1 does not take influence of other electrical components housed in the electrical junction box than the relay into consideration. Since the electrical junction box houses other various electrical components than the relay, influence of heat generated on such other electrical components, or influence of varied timing of supply/non-supply of the current depending on the kinds of electrical component, may cause the relay to easily have the problem of the poor conduction, which is caused by the freezing, at the contact.

Therefore there is a need in the art to prevent a malfunction of a start electrical component.

SUMMARY

The electrical junction box according to the present invention includes a casing configured to be mounted in a vehicle, a start electrical component housed in the casing and to which a current is supplied at least at a start of the vehicle, an operational electrical component housed in the casing and to which a current is supplied at least during an operation of the vehicle, and a heat shield wall disposed between the start electrical component and the operational electrical component. The start electrical component includes an electrical component case and a terminal portion. The terminal portion is housed in the electrical component case and has a contact.

The electrical junction box described in the specification includes a casing configured to be mounted in a vehicle, a start electrical component housed in the casing and to which a current is supplied at least at a start of the vehicle, an operational electrical component housed in the casing and to which a current is supplied at least during an operation of the vehicle, and a heat shield wall disposed between the start electrical component and the operational electrical component. The start electrical component includes an electrical component case and a terminal portion. The terminal portion is housed in the electrical component case and has a contact.

In this configuration, at the start of the vehicle, the operation of the vehicle is started by the current supplied to the start electrical component that is housed in the casing, and during the operation, the current is supplied to the operational electrical component housed in the casing. Thus, during the operation of the vehicle, heat is generated on the operational electrical component due to the supply of the current. At this time, if the heat is transmitted from the operational electrical component to the electrical component case of the start electrical component, the electrical component case of the start electrical component has a temperature higher than that of the terminal portion having the contact, and thus a large difference in the temperature occurs. Accordingly, the condensation and the freezing of the moisture in the electrical component case easily occur on the contact, which may result in the malfunction of the start electrical component.

In this embodiment, since the heat shield wall is disposed between the operational electric component and the start electrical component, the heat generated on the operational electrical component is hardly transmitted to the electrical component case of the start electrical component, and thus the temperature of the electrical component case is less likely to increase. Accordingly, even if the operation of the vehicle is stopped in a low temperature environment, the difference is less likely to occur in the temperature between the electrical component case of the start electrical component and the terminal portion having the contact. Thus, the condensation and the freezing of the moisture in the electrical component case hardly occur on the contact, and thus the situation in which the current cannot be supplied to the start electrical component at the restart of the vehicle can be avoided.

The above-described start electrical component is not limited to one to which the current is supplied only at the start of the vehicle, but may be one to which the current is supplied during the operation of the vehicle and when the operation of the vehicle is stopped in addition to at the start of the vehicle. Further, the operational electrical component is not limited to one to which the current is always supplied during the operation of the vehicle, but may be one to which the current is sometimes supplied or sometimes not supplied during the operation of the vehicle (for example, to which the current is usually supplied and temporarily not supplied, or to which the current is usually not supplied and temporarily supplied). In addition, the operational electrical component is not limited to one to which the current is supplied only during the operation of the vehicle, but may be one to which the current is supplied during the operation of the vehicle and when the operation of the vehicle is stopped.

The following configurations are preferable as embodiments of the technique described in the specification.

(1) The casing houses a circuit board on which the start electrical component and the operational electrical component are mounted, and the circuit board has a circuit pattern connected to the terminal portion. In this configuration, the terminal portion having the contact of the start electrical component is connected to the circuit pattern formed on the circuit board. Accordingly, a decrease in the temperature of the terminal portion is likely to be facilitated by the circuit pattern in a low temperature environment, but the condensation and the freezing on the contact hardly occur, because the temperature of the electrical component case is less likely to increase by the heat shield wall as described above and the difference in the temperature between the electrical component case and the terminal portion having the contact is made smaller.

(2) The heat shield wall has a tubular shape having a bottom and an opening that opens toward the circuit board. The heat shield wall surrounds the start electrical component. With this configuration, the start electrical component is hardly exposed, or exposed only a little, to a side of the operational electrical component, because the start electrical component is disposed in a space surrounded by the circuit board and the heat shield wall, which has the tubular shape having the bottom and the opening that opens toward the circuit board. Accordingly, the heat from the operational electrical component is further hardly transmitted to the electrical component case of the start electrical component, and thus the temperature of the electrical component case is less likely to increase.

(3) The start electrical component includes a plurality of start electrical components and the start electrical components are mounted on the circuit board, and the heat shield wall includes a plurality of heat shield walls and the heat shield walls individually surround each of the start electrical components. With this configuration, higher heat shield effect can be obtained compared to a heat shield wall that collectively surrounds the multiple start electrical components.

(4) The heat shield walls are adjacent to each other, and the adjacent heat shield walls are connected to each other via a heat shield wall connecting member. With this configuration, the strength of each heat shield wall can be maintained high by the heat shield wall connecting member.

(5) The start electrical component is disposed more exterior than the operational electrical component in the casing. With this configuration, the decrease in the temperature of the electrical component case of the start electrical component in the low temperature environment can be facilitated, because the heat can be easily released to the outside at the outer side in the casing compared to at the inner side. Accordingly, the difference in the temperature between the electrical component case and the terminal portion having the contact can be further made smaller.

(6) The start electrical component is disposed on an outer end of the casing. With this configuration, the decrease in the temperature of the electrical component case in the low temperature environment can be further facilitated, and the difference in the temperature between the electrical component case and the terminal portion having the contact can be further made smaller, because the start electrical component is disposed on the outer end of the casing, where the heat can be particularly easily released to the outside.

(7) The heat shield wall is integrally formed with the casing. This is preferred for the reason that the production cost can be reduced, e.g., the number of steps for assembling can be reduced, compared to the case in which a heat shield wall is a separate member from the casing.

(8) In the casing, a connector is disposed at a position adjacent to the heat shield wall, and a connector/heat shield wall connecting member that connects the heat shield wall and the connector that are adjacent to each other is provided. With this configuration, the strength of the heat shield wall and the connector can be maintained high by the connector/heat shield wall connecting member.

(9) The electrical junction box includes a circuit board, on which the start electrical component and the operational electrical component are mounted, and a plate member. The circuit board has a circuit pattern connected to the terminal portion. The plate member is disposed such that at least the start electrical component is disposed between the plate member and the circuit board. In this configuration, at the start of the vehicle, the operation of the vehicle is started by the current supplied to the start electrical component that is housed in the casing, and during the operation, the current is supplied to the operational electrical component housed in the casing. Thus, during the operation of the vehicle, heat is generated on the operational electrical component, due to the supply of the current. At this time, if the heat is transmitted from the operational electrical component to the electrical component case of the start electrical component, the temperature of the electrical component case increases. Particularly, since the start electrical component is disposed between the circuit board and the plate member, the electrical component case does not have high heat dissipation. If the heat is transmitted from the operational electrical component to the electrical component case, the heat is likely to be accumulated on the electrical component case. If the operation of the vehicle is stopped in the low temperature environment, the difference in the temperature between the electrical component case of the start electrical component and the terminal portion having the contact is likely to be made large, because the terminal portion of the start electrical component that is connected to the circuit pattern of the circuit board is more easily cooled than the electrical component case. Accordingly, the condensation and the freezing of the moisture in the electrical component case easily occur on the contact, which may result in a malfunction of the start electrical component.

In this embodiment, since the heat shield wall is disposed between the operational electrical component and the start electrical component, the heat generated on the operational electrical component during the operation of the vehicle is hardly transmitted to the electrical component case of the start electrical component, and thus the temperature of the electrical component case is less likely to increase. Accordingly, even if the operation of the vehicle is stopped in the low temperature environment, the difference in the temperature between the electrical component case of the start electrical component and the terminal portion having the contact can be made smaller. Thus, the condensation and the freezing of the moisture in the electrical component case hardly occur on the contact, and the situation in which the current is not supplied to the start electrical component at the restart of the vehicle can be avoided.

(10) The heat shield wall divides a space between the circuit board and the plate member into a first space on an outer side and a second space on an inner side of the casing, and the start electrical component is disposed in the first space and the operational electrical component is disposed in the second space. In this configuration, the decrease in the temperature of the electrical component case of the start electrical component at a time when the operation of the vehicle is stopped in the low temperature environment can be facilitated by arranging the start electrical component in the first space, because the heat in the first space on the outer side of the casing can be easily released to the outside compared to the second space on the inner side. In addition, the difference in the temperature between the electrical component case and the terminal portion having the contact can be further made smaller, because the heat is hardly transmitted from the operational electrical component to the electrical component case of the start electrical component due to the heat shield wall that divides the space into the first space on the outer side and the second space on the inner side.

(11) The heat shield wall has a configuration that allows the first space to open at least toward a side opposite to the second space. With this configuration, the heat can be easily released from the first space to the outside compared to the case in which a heat shield wall surrounds the first space, because the first space opens to the side opposite to the second space, i.e., opens toward the outside of the casing. Accordingly, the decrease in the temperature of the electrical component case of the start electrical component in the low temperature environment is further facilitated, and thus the difference in the temperature between the electrical component case and the terminal portion having the contact can be further made smaller.

(12) The heat shield wall has a configuration that allows the first space to open in a direction intersecting with an arrangement direction of the first space and the second space. With this configuration, the first space can open to a larger area, and thus the heat can further easily be released from the first space to the outside. Accordingly, the decrease in the temperature of the start electrical component of the electrical case in the low temperature environment can be further facilitated.

(13) The first space defined by the heat shield wall includes an outer end portion of the casing, and the start electrical component is disposed in the outer end portion. With this configuration, the decrease in the temperature of the start electrical component in the low temperature environment can be further facilitated, and the difference in the temperature between the electrical component case and the terminal portion having the contact can be further made smaller, because the first space includes the outer end portion and the start electrical component is disposed on the outer end portion where the heat can be particularly easily released to the outside.

(14) The first space defined by the heat shield wall includes a corner of the casing, and the start electrical component is disposed at the corner. With this configuration, the decrease in the temperature of the electrical component case can be further facilitated, because the first space includes the corner and the start electrical component is disposed at the corner where, among the outer end portion, the heat can be particularly easily released to the outside.

(15) The plate member is a second circuit board that has a circuit pattern connected to the circuit pattern of the circuit board. In this configuration, since the heat is generated on the second circuit board due to the supply of the current to the circuit pattern thereof, the heat may be transmitted to the electrical component case of the start electrical component disposed between the second circuit board and the circuit board, and the difference in the temperature between the electrical component case and the terminal portion may be made large. Even in such a case, as described above, the difference in the temperature between the electrical component case and the terminal portion having the contact is made smaller, because the temperature of the electrical component case is less likely to increase due to the heat shield wall. Accordingly, the condensation and the freezing hardly occur on the contact.

(16) A second heat shield wall is disposed between the start electrical component and the second circuit board. With this configuration, the second heat shield wall blocks the heat from the second circuit board, and thus the heat is hardly transmitted to the start electrical component. Accordingly, a temperature of the electrical component case is further less likely to increase, and thus a difference in the temperature between the electrical component case and the terminal portion having the contact can be made smaller.

(17) The heat shield wall and the second heat shield wall are continuous from each other. With this configuration, the mechanical strength can be improved in addition to the high heat shield effect.

(18) A relay terminal portion through which the circuit board and the second circuit board are connected to each other is provided, and the heat shield wall has the surface that extends along the relay terminal portion. With this configuration, the relay terminal portion can be guided by the surface of the heat shield wall during a connection operation, and thus assemble workability can be improved.

(19) The heat shield wall has the bent shape in a cross section taken along a plate surface of the circuit board. With this configuration in which the heat shield wall has the bent shape, the mechanical strength of the heat shield wall can be maintained high, and the shield wall is hardly improperly deformed. Accordingly, the heat shield wall hardly comes in contact with the start electrical component and the operational electrical component.

(20) A reinforcing rib that connects surfaces of the heat shield wall having the bent shape is provided. With this configuration, the mechanical strength of the heat shield wall can be further improved.

(21) A reinforcing member that extends along the plate surface of the circuit board and a surface of the heat shield wall is provided. With this configuration, the mechanical strength of the heat shield wall can be further improved by the reinforcing member, and the heat shield wall is hardly improperly deformed. Accordingly, the heat shield wall hardly comes in contact with the start electrical component and the operational electrical component.

(22) The start electrical component is a relay, and the contact of the terminal portion at least includes a fixed contact and a movable contact that is movable toward or away from the fixed contact. With this configuration, the condensation and the freezing of the moisture in the electrical component case hardly occur on one or both of the fixed contact and the movable contact included in the terminal portion due to the above-described heat shield wall, and thus the movable contact can contact properly with the fixed contact at the restart of the vehicle. Accordingly, the relay can properly exhibit its switching function.

According to the technique described in the specification, a malfunction hardly occurs in the start electrical components.

Effect of the Invention

According to the present invention, a malfunction hardly occurs in the start electrical components.

MODES FOR CARRYING OUT THE INVENTION

First Embodiment

A first embodiment of the present invention will be described with reference to FIG. 1 to FIG. 7. An electrical junction box 10 according to this embodiment is configured to be installed in a vehicle which is not illustrated. The electrical junction box 10 is connected between a battery (a power source), which is not illustrated, and various vehicle electrical components, which are not illustrated, and is configured to control whether or not to supply a current to the vehicle electrical component. The electrical junction box 10 is attached in an engine room of the vehicle, for example. Examples of the vehicle electrical component include various lamps (such as a headlamp, a brake lamp, a hazard lamp (a winker lamp), and a vehicle compartment lamp), an air-conditioner, a power window, a power steering, a power seat, a horn, a wiper, a defroster, a seat heater, a starter, an engine control unit (ECU), a fuel pump, and an ignition. An X-axis, a Y-axis, and a Z-axis are described in a part of the drawings. The axes in each drawing correspond to the respective axes in other drawings. An upper side in FIG. 4 and FIG. 5 corresponds to a front side. A lower side in FIG. 4 and FIG. 5 corresponds to a rear side.

Figure 1:
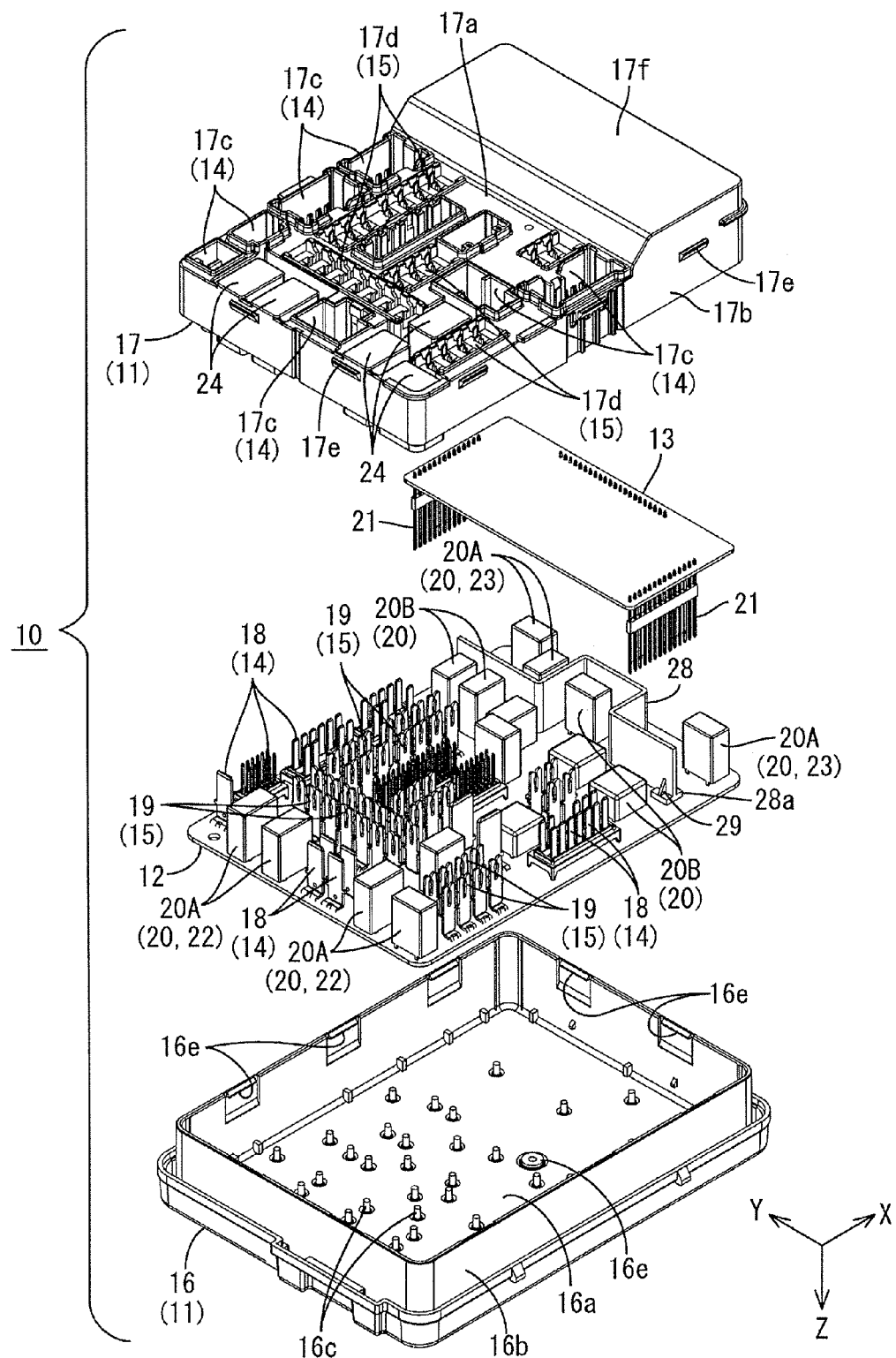
FIG. 1 is an exploded perspective view of an electrical junction box according to a first embodiment of the present invention.

As illustrated in FIG. 1, the electrical junction box 10 has a horizontally elongated rectangular shape as a whole. The electrical junction box 10 includes a casing (a box, an exterior body) 11, a first circuit board 12 that is housed in the casing 11, and a second circuit board 13 that is housed in the casing 11 and disposed over the first circuit board 12. The electrical junction box 10 includes connectors (operational electrical components) 14 to each of which a counter connector (not illustrated) that is provided at an end portion of an electric wire (a wire harness), which is electrically connected to the battery or the vehicle electric component, is connected. The electrical junction box 10 further includes fuse connectors (the operational electrical components) 15 each of which is configured to receive and to be connected to a fuse which is not illustrated. The counter connectors and the fuses are configured to be inserted in the electrical junction box 10 from the front side in the Z-axis direction. A long-side direction, a short-side direction, and a thickness direction of the electrical junction box 10 correspond to the X-axis direction, the Y-axis direction, and the Z-axis direction, respectively, in each drawing.

The casing 11 is made of synthetic resin. As illustrated in FIG. 1, the casing 11 has the same horizontally elongated rectangular shape as the electrical junction box 10. The casing 11 includes assembled two casing members 16, 17 each on the front side or the rear side (in a vertical direction in FIG. 1).

One of the casing members 16, 17 that is disposed on the rear side (a lower side in FIG. 1) is a first casing member (a lower case) 16 and the other one of them that is disposed on the front side (an upper side in FIG. 1) is a second casing member (an upper case) 17. The first casing member 16 and the second casing member 17 that are assembled have an internal space having a predetermined size. The first circuit board 12 and the second circuit board 13 can be housed in the space. An assembling direction of the casing members 16, 17 corresponds to the Z-axis direction.

Figure 4:
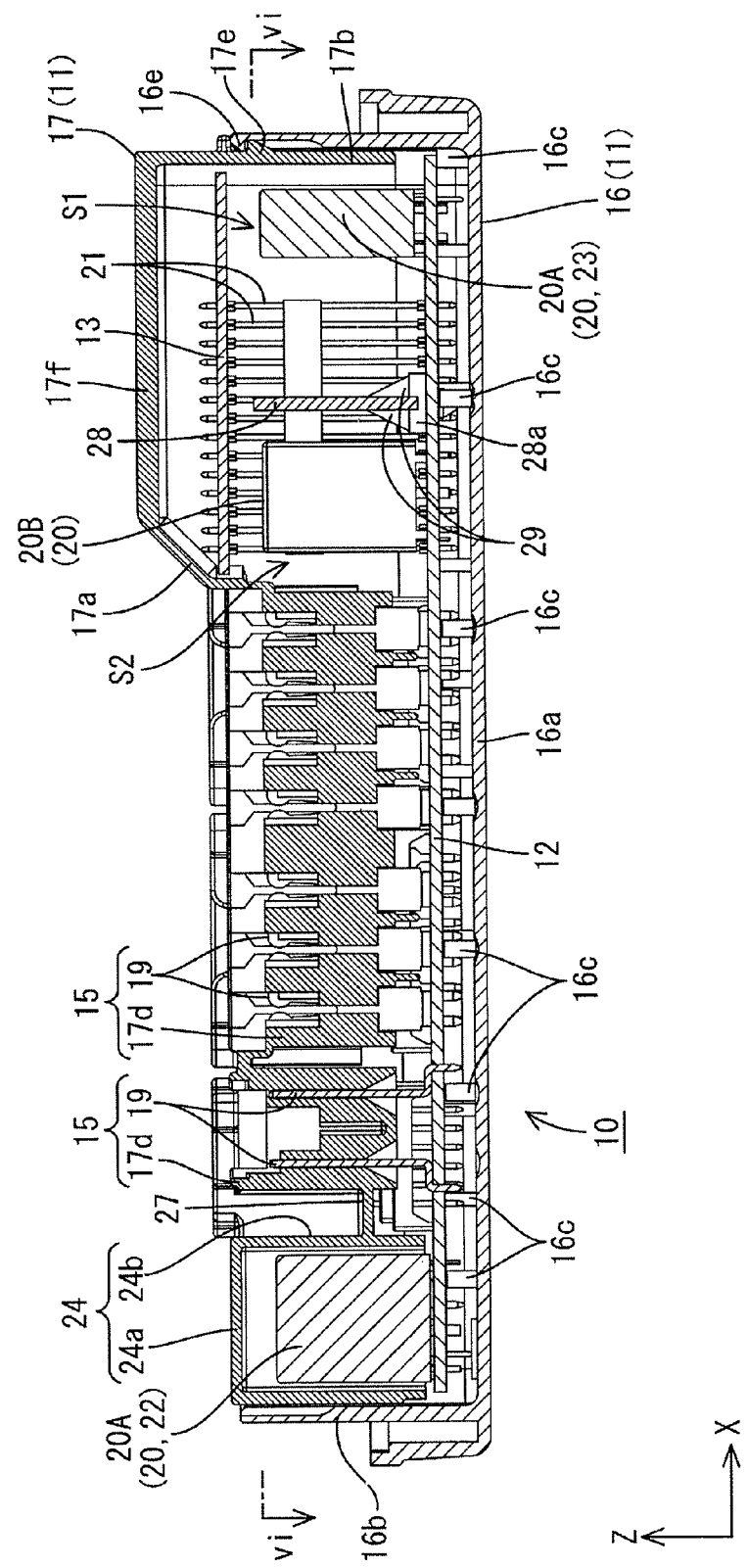
FIG. 4 is a cross-sectional view taken along a line iv-iv in FIG. 3.

As illustrated in FIG. 1, the first casing member 16 has a box-like shape that opens toward the front side in the Z-axis direction (toward the upper side in FIG. 1). The first casing member 16 includes a bottom plate 16a that extends in the X-axis direction and the Y-axis direction (along a plate surface of the first circuit board 12) and an outer plate 16b that extends upward from an outer edge of the bottom plate 16a in the Z-axis direction and has a substantially rectangular tubular shape. Multiple support projections 16c that are configured to support the first circuit board 12 from the rear side are dispersedly disposed on a surface of the bottom plate 16a of the first casing member 16. The bottom plate 16a includes a screw receiving part 16d to which a screw is fastened to fix the second casing member 17. As illustrated in FIG. 4, locking portions 16e are disposed on an inner surface of the outer plate 16b to maintain the assembled state of the casing members 16, 17. Each locking portion 16e is a tab-like protrusion and formed at a front edge of the outer plate 16b. The locking portions 16e are disposed on each of long sides and short sides of the outer plate 16b.

As illustrated in FIG. 1, the second casing member 17 has a box-like shape that opens toward the rear side in the Z-axis direction (toward the lower side in FIG. 1). The second casing member 17 generally includes a cover 17a and an inner plate 17b. The cover 17a faces the bottom plate 16a of the first casing member 16 and covers the first circuit board 12 and the second circuit board 13 from the front side. The inner plate 17b extends from an outer edge of the cover 17a toward the rear side and has a substantially rectangular tubular shape. The cover 17a includes connector hoods 17c and fuse attachments 17d. The connector hoods 17c each constitute the connector 14 together with a connector terminal 18 which is mounted on the first circuit board 12. The connector terminal 18 will be described later. The fuse attachments 17d each configure the fuse connector 15 together with a fuse connecting terminal 19 mounted on the first circuit board 12. Almost all of the connector hoods 17c and the fuse attachments 17d (specifically, except for the connector hood 17c that is disposed at an upper left corner in FIG. 3) are concentrated at a middle of the cover 17a in the long-side direction thereof. Each connector hood 17c surrounds multiple connector terminals 18 collectively and has a substantially rectangular tubular shape that opens toward the front side such that the counter connector can be fitted thereto from the front side. Each fuse attachment 17d surrounds the fuse connecting terminals 19 individually and has a substantially rectangular tubular shape that opens toward the front side and has fuse attachment spaces to which the above-described fuses can be individually fitted from the front side. The cover 17a includes a closed section 17f at one end in the long-side direction thereof (an upper right end in FIG. 1, a right end in FIG. 3). The closed section 17f is located slightly above the connector hoods 17c and the fuse attachments 17d and has no opening. The closed section 17f can cover substantially the entire area of the second circuit board 13.

Figure 2:
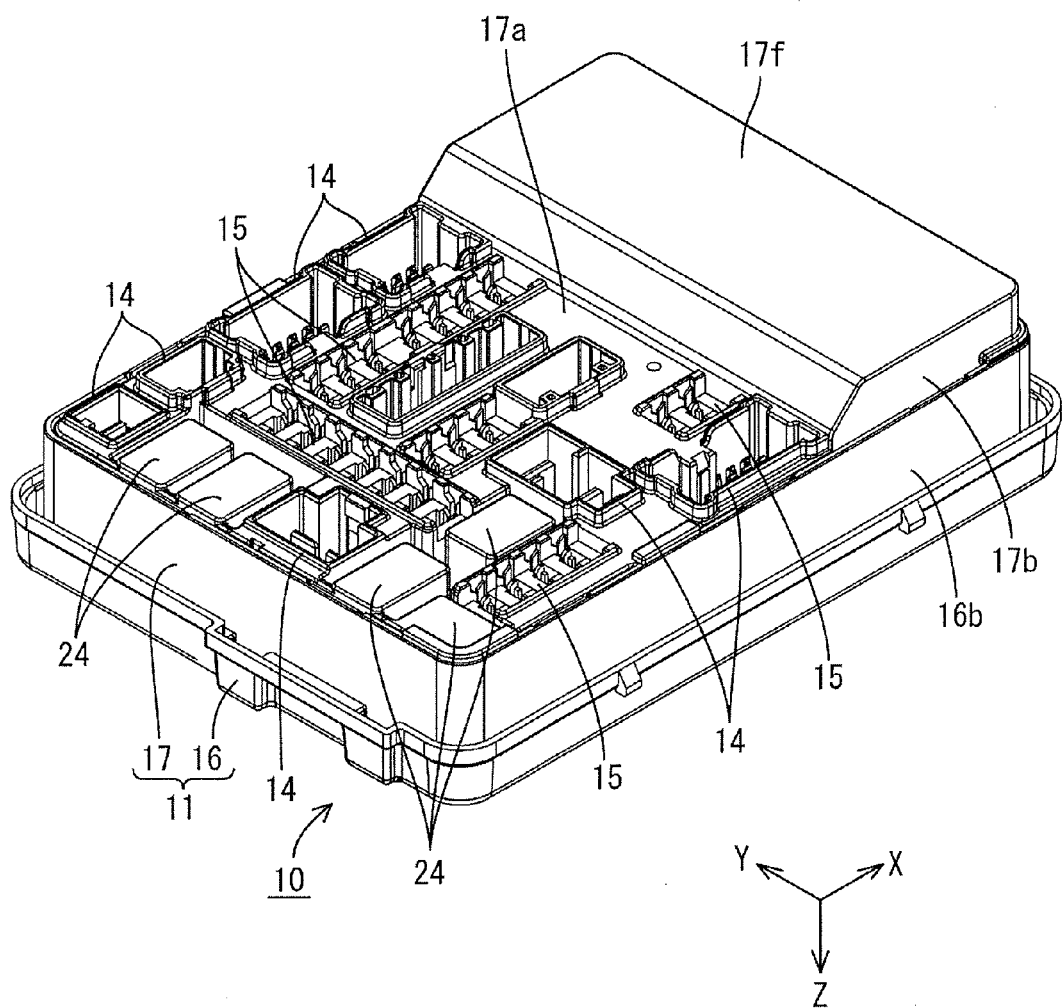
FIG. 2 is a perspective view of the electrical junction box.

The inner plate 17b is configured to be fitted to an inner surface of the outer plate 16b of the first casing member 16. As illustrated in FIG. 2 and FIG. 4, in the casings 16, 17 that are assembled, the inner plate 17b is surrounded by the outer plate 16b along its entire outer circumference from the outer side. The inner plate 17b has locking protrusions 17e at its outer surface. The locking protrusions 17e and the locking portions 16e of the outer plate 16b are locked together to maintain the assembled state of the casing members 16, 17. The locking protrusions 17e each protrude from the outer surface of the inner plate 17b. Multiple locking protrusions 17e are disposed on long sides and short sides of the inner plate 17b.

The first circuit board 12 is made of synthetic resin, and extends along a plate surface of the bottom plate 16a of the first casing member 16 with a horizontally elongated plate shape extending over substantially entire area of the bottom plate 16a as illustrated in FIG. 1. On a front plate surface of the first circuit board 12, the connector terminals 18 that constitute the connector 14, the fuse connecting terminals 19 that constitute the fuse connectors 15, and relays (the start electrical component, the operational electrical component) 20 are mounted. The first circuit board 12 has a circuit pattern (not illustrated) that is connected to the connector terminals 18, the fuse connecting terminals 19, and the relays 20. The current supplied from the battery flows through the circuit pattern. The first circuit board 12 is a "power circuit board" that relays the power supply from the battery to the vehicle electrical components. The relay 20 mounted on the first circuit board 12 is configured to control whether or not to supply a current to the first circuit board 12.

Figure 3:
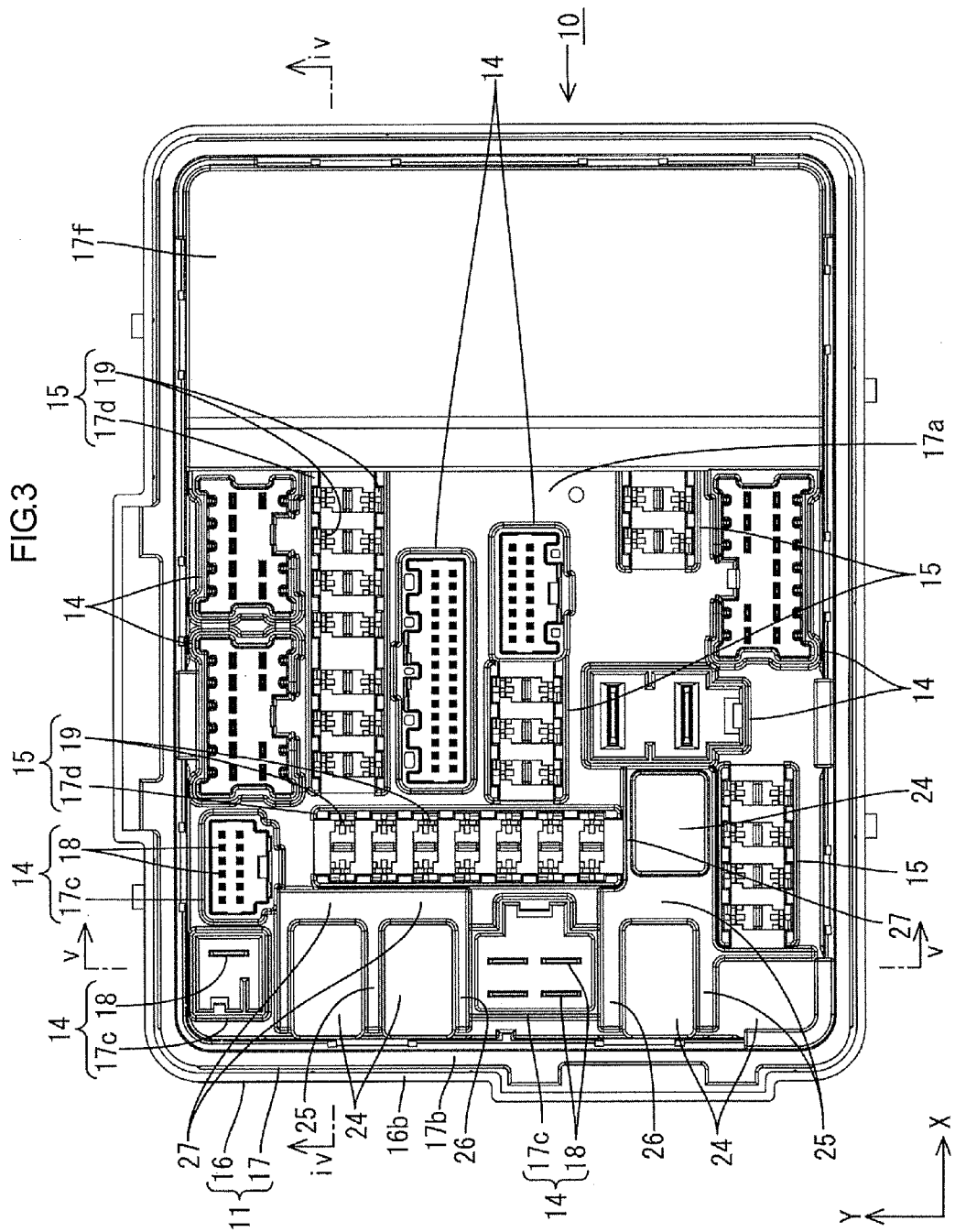
FIG. 3 is a top view of the electrical junction box.

As illustrated in FIG. 1, the connector terminals 18 protrude from the front plate surface of the first circuit board 12 toward the front side and each have a tab-like shape. The connector terminals 18 are disposed on the first circuit board 12 in bunches such that each bunch is disposed in an area surrounded by each connector hoods 17c. The fuse connecting terminals 19 protrude from the front plate surface of the first circuit board 12 toward the front side and each have a tuning-fork like shape that has a two-pronged front end. The fuse connecting terminals 19 are disposed beside one another on the first circuit board 12 such that the fuse connecting terminals 19 are individually disposed in each fuse attachment space of the fuse attachment 17d. As illustrated in FIG. 1 and FIG. 3, almost all of the connector terminals 18 and the fuse connecting terminals 19 (except for the connector terminals 18 that are disposed at the upper left corner in FIG. 3) are concentrated at the middle of the first circuit board 12 in the long-side direction.

The relay 20 is an electrical component that is configured to control whether or not to supply the power from the battery to a vehicle electrical component. As illustrated in FIG. 1, multiple relays 20 are provided for the respective vehicle electrical components to control whether or not to supply the current thereto. When the current starts flowing through the relay 20, the current is supplied to the corresponding vehicle electrical component. When no current flows through the relay 20, the current is not supplied to the corresponding vehicle electrical component. As illustrated in FIG. 1 and FIG. 3, the relays 20 are disposed on each end section of the first circuit board 12 in the longitudinal direction. In other words, the relays 20 are dispersedly disposed with the connector terminals 18 and the fuse connecting terminals 19 therebetween. The middle of the first circuit board 12 in the long-side direction is an area for the connector terminals 18 and the fuse connecting terminals 19. The end sections in the long-side direction are areas for the relays 20.

Figure 7:
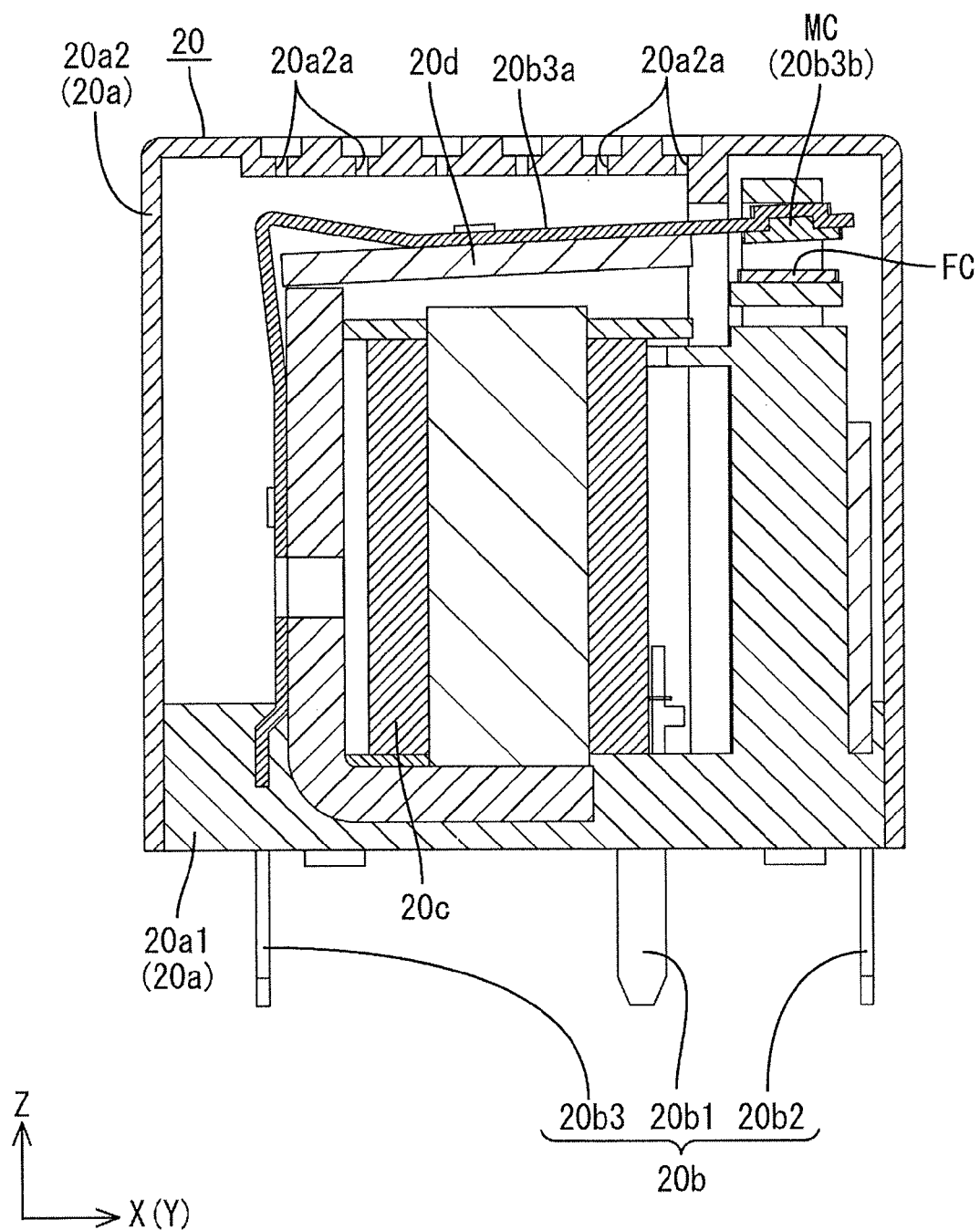
FIG. 7 is a side cross-sectional view schematically illustrating a relay included in the electrical junction box.

A configuration of the relay 20 will be described in detail. As illustrated in FIG. 1 and FIG. 7, the relay 20 includes a relay case (an electrical component case) 20a that is made of synthetic resin, a terminal portion 20b that is made of metal and has a part protruding outward from the bottom surface of the relay case 20a, and a coil 20c that is housed in the relay case 20a. The relay case 20a has a block-like shape elongated in the z-axis direction as a whole and has a housing space for the terminal portion 20b and the coil 20c therein. The relay case 20a includes a base 20a1 that has a bottom surface and a cover 20a2 that has a substantially cylindrical shape with a bottom and covers the base 20a1. The cover 20a2 includes ventilation holes 20a2a (six ventilation holes 20a2a) that communicate with the outer space at its ceiling (a portion facing a movable portion of a movable contact terminal portion 20b3, which will be described later). The ventilation holes 20a2a are located beside one another at intervals. Through the ventilation holes 20a2a, the moisture generated by the heated coil 20c can be released to the outside, and the heat generated on the terminal portion 20b and the coil 20c therein can be released. The terminal portion 20b includes two coil terminal portion 20b1 each of which is connected to each end portion of a winding wire of the coil 20c in the relay case 20a, a fixed contact terminal portion 20b2 having a fixed contact FC, and a movable contact terminal portion 20b3 having a movable contact MC. The movable contact terminal portion 20b3 has a cantilever-like shape and has a movable portion that can be elastically deformed by a magnetic field of the coil 20c. The movable contact MC at a front end of the movable contact terminal portion 20b3 is movable toward or away from the fixed contact FC of the fixed contact terminal portion 20b2. The movable contact terminal portion 20b3 includes a terminal body 20b3a having the movable portion and a contact member 20b3b having the movable contact MC. The former (the terminal body 20b3a) is made of metal material that provides high durability to a spring included in the movable portion. The latter (the contact member 20b3b) is made of metal material having high conductivity. To the movable portion of the terminal body 20b3a, a magnetic member 20d that is a magnetic body is attached. The magnetic member 20d is made of magnetic material such as iron. The magnetic member 20d is disposed between the movable portion and the coil 20c and is configured to displace the movable portion by electromagnetic induction of the coil 20c. In the relay 20 in which the current is not supplied to the coil 20c, the fixed contact FC and the movable contact MC are away from each other and not in contact with each other, and thus the current does not flow between the fixed contact terminal portion 20b2 and the movable contact terminal portion 20b3. On the other hand, in the relay 20 in which the current is supplied to the coil 20c through the coil terminal portion 20b1, the magnetic member 20d is attracted toward the coil 20c by the electromagnetic induction of the coil 20c, and the movable contact terminal portion 20b3 is displaced such that the movable contact MC thereof comes in contact with the fixed contact FC. Thus, the current starts flowing between the fixed contact terminal portion 20b2 and the movable contact terminal portion 20b3. In other words, the relay 20 has a contact structure of a form A contact. The terminal portions 20b1, 20b2, 20b3 each have a portion that protrudes from the bottom surface of the relay case 20a and is soldered to the first circuit board 12 and connected to the circuit pattern at the portion.

The relay 20 includes two kinds of relay to each of which the current is supplied at a different timing according to a vehicle electrical component to be controlled. Specifically, the relay 20 includes a start relay 20A and an operational relay 20B. The start relay 20A is a start electrical component to which a current is supplied at the start of the vehicle. The operational relay 20B is an operational electrical component to which a current is supplied during the operation of the vehicle. Specifically, the start relay 20A is configured to control whether or not to supply the current to vehicle electrical components such as a starter, an engine control unit, a fuel pump, and an ignition. The operational relay 20B is configured to control whether or not to supply the current to vehicle electrical components such as various lamps, an air conditioner, a power window, a power steering, a power seat, a horn, a wiper, a defroster, and a seat heater. The connector 14 (the connector terminals 18) and the fuse connector 15 (the fuse connecting terminals 19) are the operational electrical component, like the above-described start relay 20B, because the current is supplied thereto during the operation of the vehicle.

The "start electrical component (the start relay 20A)" is not limited to one to which the current is supplied only at the start of the vehicle, but may be one to which the current is supplied during the operation of the vehicle and when the operation of the vehicle is stopped in addition to at the start of the vehicle. The "operational electrical component (the operational relay 20B, the connector 14, and the fuse connector 15)" is not limited to one to which the current is always supplied during the operation of the vehicle, but may be one to which the current is supplied and no current is supplied during the operation of the vehicle (for example, to which the current is usually supplied and temporarily not supplied, or to which the current is usually not supplied and temporarily supplied). In addition, the "operational electrical component" is not limited to one to which the current is supplied only during the operation of the vehicle, but may be one to which the current is supplied during the operation of the vehicle and when the operation of the vehicle is stopped.

The second circuit board 13 is made of synthetic material, and as illustrated in FIG. 1, extends parallel to the plate surface of the first circuit board 12 with a vertically elongated plate shape. The second circuit board 13 is smaller than the first circuit board 12. The second circuit board 13 is housed in the casing 11 such that the long-side direction thereof corresponds to the short-side direction (the Y-axis direction) of the first circuit board 12 and the short-side direction thereof corresponds to the long-side direction (the X-axis direction) of the first circuit board 12. The second circuit board 13 is located in the casing 11 at a position closer to an end in the long-side direction (the X-axis direction) of the casing 11. Specifically, the second circuit board 13 is disposed at a position overlapping with an end section of the first circuit board 12 in the long-side direction and the closed section 17f of the cover 17a of the second casing member 17. As illustrated in FIG. 4, the second circuit board 13 is disposed on the front side of the first circuit board 12 in the Z-axis direction with a predetermined distance therebetween. In this configuration, the housing space for the relays 20 is defined between the first circuit board 12 and the second circuit board 13. In other words, the second circuit board 13 is positioned so as to have the relays 20 between the second circuit board 13 and the first circuit board 12. On the second circuit board 13, various electrical components (not illustrated) such as a resistor, a capacitor, a transistor, and a microcomputer are mounted and a circuit pattern (not illustrated) that is to be connected to the various electrical components are formed.

Further, as illustrated in FIG. 1, one end of each relay terminal portion 21 is mounted to the second circuit board 13. The other end of each relay terminal portion 21 is inserted into the first circuit board 12 to connect the circuit patterns of the first and second circuit boards 12, 13 through the relay terminal portion 21. The relay terminal portions 21 each include prismatic terminals that are arranged beside one another in a straight line in the X-axis direction or the Y-axis direction. The relay terminal portions 21 are each disposed on each short-side end of the second circuit board 13 and on one long-side end that is located on the outer side of the casing 11 (the right side in FIG. 6). The second circuit board 13 is a "control circuit board" that can control an operation state (whether or not to supply the current) of the relay 20 or other components, which are mounted on the first circuit board 12, by the mounted electrical components.

Figure 6:
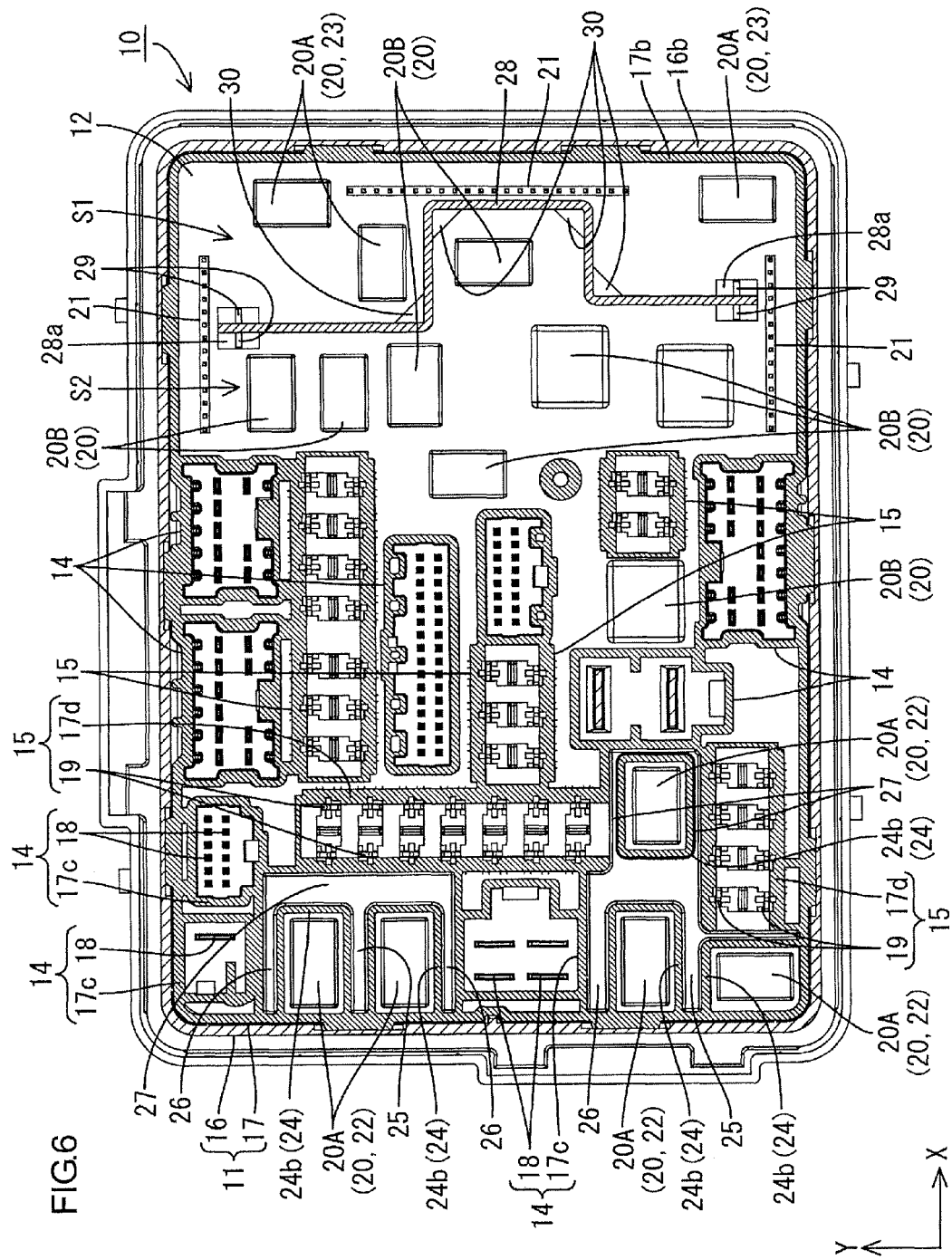
FIG. 6 is a cross-sectional view taken along a line vi-vi in FIG. 4.

In this embodiment, positions of the relays 20 in the casing 11 are each determined depending on its kind as follow. As illustrated in FIG. 1 and FIG. 6, the start relays 20A of the relays 20 are disposed relatively on the outer side in the casing 11 and the operational relays 20B are disposed relatively on the inner side in the casing 11. Specifically, multiple start relays 20A are disposed on each end section in the long-side direction of the casing 11 and the first circuit board 12 such that the start relays 20A constitute two start relay groups 22, 23. The first start relay group 22 includes the relays 20 that are disposed on the end section (the end section on the left in FIG. 6) that is one of the end sections in the long-side direction and does not overlap with the second circuit board 13 in a plan view. The second start relay group 23 includes the relays 20 that are disposed on the end section (the end section on the right in FIG. 6) and overlaps with the second circuit board 13 in a plan view. In contrast, multiple operational relays 20B are disposed between the second start relay group 23 and a group of the connectors 14 and the fuse connecting portions 15, which are concentrated at the middle of the casing 11 and the first circuit board 12 in the long-side direction. The operational relays 20B are located adjacent to the group of the connectors 14 and the fuse connecting portions 15, and are the operational electrical components like the connectors 14 and the fuse connectors 15. Thus, the operational electrical components are concentrated at the middle of the first circuit board 12 in the long-side direction. That is, the middle section of the first circuit board 12 in the long-side direction is an arrangement area for the operational electrical components and the end sections are arrangement areas for the start electrical components.

More specifically described, as illustrated in FIG. 6, the start relays 20A that are included in the first start relay group 22 include a total of five start relays 20A. Four of the start relays 20A are disposed on the end section in the long-side direction of the first circuit board 12 such that two pairs of them, each of which includes two start relays 20A adjacent to each other in the Y-axis direction, are disposed on each side in the Y-axis direction with the connector 14 that is disposed at the middle in the short-side direction (the Y-axis direction) therebetween. The remaining one of the start relays 20A is disposed on the inner side in the long-side direction (the X-axis direction) at a position adjacent to one of the start relays 20A that is disposed on the end portion extending in the short-side direction (at a lower end portion illustrated in FIG. 6). The four of the start relays 20A that are disposed with the connector 14 therebetween are disposed on the outer end portion of the casing 11. One of the start relays 20A is disposed at one corner of the casing 11 (a lower left corner illustrated in FIG. 6). The start relays 20A that are included in the second start relay group 23 include a total of three start relays 20A. Two of the start relays 20A are disposed on the end section in the long-side direction (the first space S1) of the first circuit board 12 with the relay terminal portion 21, which is disposed at the middle in the short-side direction, therebetween. The remaining one of them is located at the middle and adjacent to the relay terminal portion 21 in the long-side direction. Two start relays 20A that are disposed with the relay terminal portion 21 therebetween are disposed on the outer end portions of the casing 11, particularly at two corners of the casing 11 (a right upper corner and a right lower corner in FIG. 6). The operational relay 20B includes five operational relays 20B that are disposed between the relay terminal portions 21 that are disposed at respective ends in the short-side direction of the first circuit board 12. In addition, the operational relay 20B further includes two operational relays 20B that are respectively disposed more interior or more exterior in the long-side direction than the operational relay 20B that is disposed at the middle in the short-side direction of the first circuit board 12. The total of seven operational relays 20B are disposed at positions overlapping with the second circuit board 13 in a plan view together with the second start relay group 23 and disposed between the first circuit board 12 and the second circuit board 13 (FIG. 4).

Figure 5:
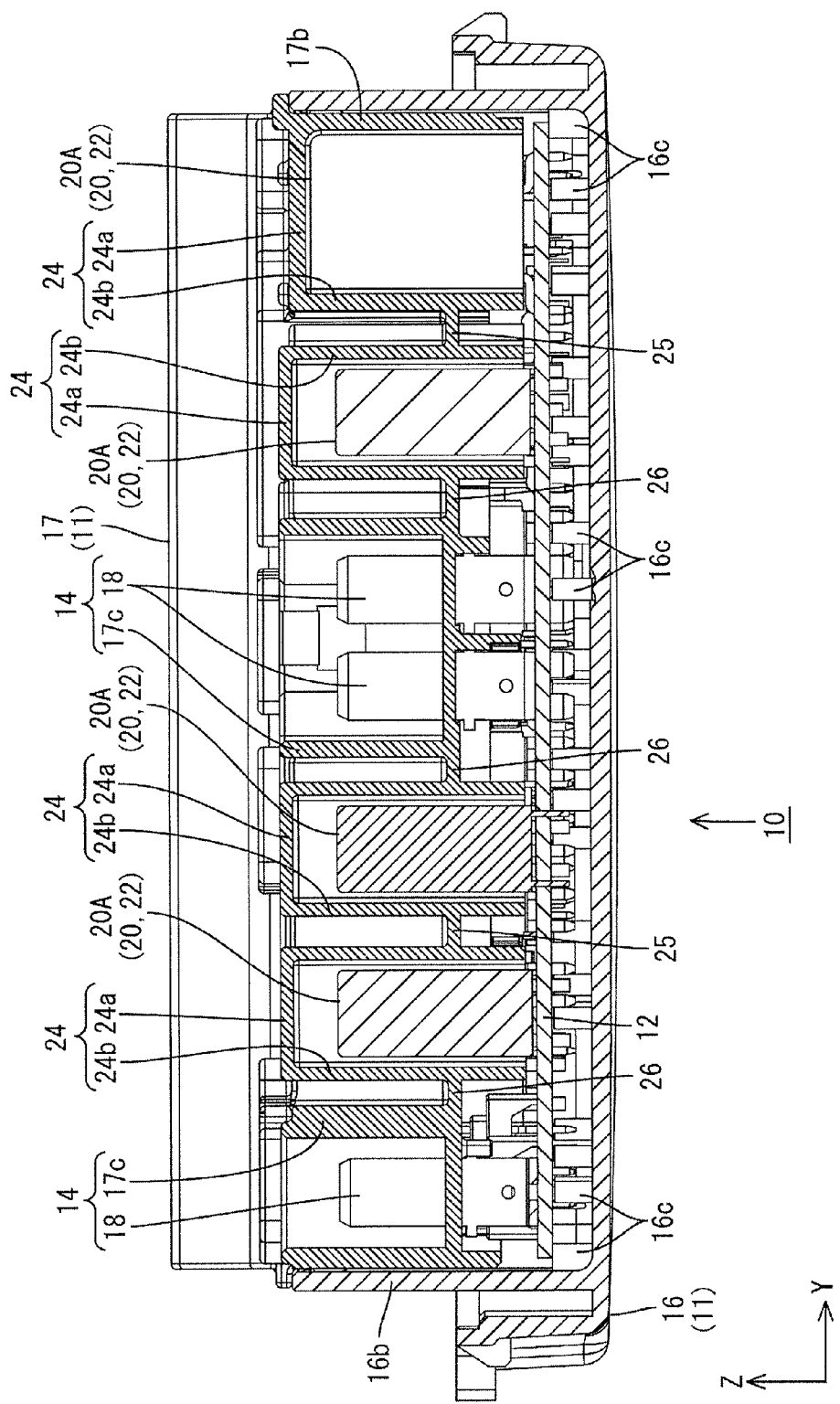
FIG. 5 is a cross-sectional view taken along a line v-v in FIG. 3.

As illustrated in FIG. 4 to FIG. 6, the electrical junction box 10 according to this embodiment includes surrounding heat shield walls (heat shield walls) 24 each of which surrounds the start relay 20A included in the first start relay group 22 and is disposed between the start relay 20A and the connector 14, the fuse connector 15, or the start relay 20B. Specifically, the surrounding heat shield wall 24 is integrally formed with the cover 17a of the second casing member 17 and has a substantially rectangular tube shape with an opening that opens toward the rear side, i.e., toward the first circuit board 12 side. The surrounding heat shield wall 24 includes a ceiling wall 24a that faces the first circuit board 12 and a side wall 24b that has a substantially rectangular tubular shape and extends from an outer edge of the ceiling wall 24a toward the rear side. The surrounding heat shield wall 24 can surround an outer surface of the start relay 20A except for the bottom surface (the surface facing the first circuit board 12). A part of the surrounding heat shield wall 24 (a part facing the outer plate 16b included in the first casing member 16) is also used as the inner plate (an outer peripheral wall) 17b included in the second casing member 17.

As illustrated in FIG. 4 and FIG. 5, in the first and second casing members 16, 17 that are assembled, the surrounding heat shield wall 24 is in contact with or adjacent to the plate surface of the first circuit board 12 at its opening edge. Accordingly, in this state, the start relays 20A are disposed between the first circuit board 12 and the surrounding heat shield wall 24, and is housed in a closed space with little gap. The outer surface of each start relay 20A is surrounded by the first circuit board 12 and the surrounding heat shield wall 24 over its substantially entire area. The surrounding heat shield walls 24 form a shape that surrounds the start relays 20A included in the first start relay group 22 individually (an individual surrounding type). The number of surrounding heat shield walls 24 is the same as the number of the start relays 20A included in the first start relay group 22 (five surrounding heat shield walls 24 in FIG. 6). In this configuration, the start relays 20A included in the first start relay group 22 are each housed in the independent housing space of each surrounding heat shield wall 24. Between two adjacent start relays 20A included in the first start relay group 22 in the X-axis direction or the Y-axis direction on the first circuit board 12, two side walls 24b of the heat shield walls 24 are disposed.

As illustrated in FIG. 4 and FIG. 5, adjacent two of the surrounding heat shield walls 24 are connected to each other via a heat shield wall connecting member 25. The heat shield wall connecting member 25 connects the side walls 24b of the adjacent surrounding heat shield walls 24 at their opposing portions. The heat shield wall connecting member 25 is disposed on each side wall 24b at a position closer to the opening edge than the ceiling wall 24a in the Z-axis direction. Further, as illustrated in FIG. 5, the surrounding heat shield wall 24 is connected to the connector hood 17c that is included in the adjacent connector 14 via a connector/heat shield wall connecting member 26. The connector/heat shield wall connecting member 26 connects the side wall 24b of the surrounding heat shield wall 24 and the connector hood 17c at their opposing portions and is disposed substantially at the same position in the Z-axis direction as the heat shield wall connecting member 25. Further, as illustrated in FIG. 4, the surrounding heat shield wall 24 is connected to the fuse attachment 17d that is included in the fuse connector 15 adjacent to the surrounding heat shield wall 24 via a fuse connector/heat shield wall connecting member 27. The fuse connector/heat shield wall connecting member 27 connects the side wall 24b of the surrounding heat shield wall 24 and the fuse attachment 17d at their opposing portions. The fuse connector/heat shield wall connecting member 27 is disposed substantially at the same position in the Z-axis direction as the heat shield wall connecting member 25.

As illustrated in FIG. 4 and FIG. 6, the electrical junction box 10 according to this embodiment includes a partition heat shield wall (a heat shield wall) 28 that is disposed between the start relays 20A included in the second start relay group 23 and the operational relays 20B that are adjacent to the second start relay group 23. The partition heat shield wall 28 divides the space between the first circuit board 12 and the second circuit board 13 into a first space S1 on an outer side of the casing 11 and a second space S2 on an inner side of the casing 11. In the first space S1, the start relays 20A included in the second start relay group 23 are disposed. In the second space S2, the operational relays 20B are disposed. The first space S1 includes an outer end portion in the long-side direction of the casing 11, particularly, two corners of the outer end portion.

Specifically, as illustrated in FIG. 4 and FIG. 6, the partition heat shield wall 28 is a separate member from the circuit boards 12, 13 and the casing members 16, 17, and is attached to the first circuit board 12. The partition heat shield wall 28 extends across the first circuit board 12 in the Y-axis direction while being bent at the middle in a plan view. The partition heat shield wall 28 extends between the relay terminal portions 21 on the ends in the short-side direction of the first circuit board 12 while being bent outward in the long-side direction of the first circuit board 12 at the middle thereof. The partition heat shield wall 28 surrounds and closes the second space S2 together with the first circuit board 12, the second circuit board 13, and the two described relay terminal portions 21. In addition, the partition heat shield wall 28 has a configuration that allows the first space S1 to open toward a side opposite to the second space S2, i.e., outwardly in the long-side direction (the X-axis direction) of the casing 11, and in a direction perpendicular to (intersecting with) an arrangement direction of the first space S1 and the second space S2, i.e., outwardly in the short-side direction (the Y-axis direction) of the casing 11. That is, the partition heat shield wall 28 allows the first space S1 to open toward the outside of the casing 11 except for the direction toward the second space S2 side, i.e., in three directions.

As illustrated in FIG. 4 and FIG. 6, the partition heat shield wall 28 includes mounts 28a on its bottom at its ends in the Y-axis direction. The mounts 28a each extend along the plate surface of the first circuit board 12. A vertical reinforcing rib 29 that connects a surface of the mount 28a and a surface of the partition heat shield wall 28 is provided. The mount 28a extends in the thickness direction of the partition heat shield wall 28 over the partition heat shield wall 28. A pair of the vertical reinforcing ribs 29 is disposed on each mount 28a. As illustrated in FIG. 4, the vertical reinforcing rib 29 has a substantially triangular shape in a side view. As illustrated in FIG. 6, the partition heat shield wall 28 has four bend portions at which the partition heat shield wall 28 is bent at a substantially right angle. A horizontal reinforcing rib 30 connects surfaces at the bend portions. The horizontal reinforcing rib 30 has a substantially triangle shape in a plan view. Two legs other than a hypotenuse extend along the surface of the bend portion of the partition heat shield wall 28. A part of the partition heat shield wall 28 that is disposed on the most outer side of the casing 11 and extends along the Y-axis direction has an outer surface that extends along the relay terminal portion 21 that is disposed at the middle in the short-side direction of the first circuit board 12. With this configuration, when the relay terminal portion 21 is inserted into the first circuit board 12 to attach the second circuit board 13, the relay terminal portion 21 is in a sliding contact with the outer surface of the partition heat shield wall 28 and can guide the insertion.

The present embodiment has the above-described configuration, and the operation thereof will be described. At the start of the vehicle, a predetermined signal is transmitted from the second circuit board 13 to the first circuit board 12 through the relay terminal portion 21 to supply the current to the start relays 20A mounted on the first circuit board 12. Then, the current is supplied to the vehicle electrical components (such as a starter, an engine control unit, a fuel pump, and an ignition) which are controlled by the start relays 20A to start the component such as the engine that is mounted in the vehicle, and thus the vehicle is in an operable state. Since the vehicle in such a state is in operation, the current is supplied or not supplied to the operational electrical components (the operational relay 20B, the connector 14, and the fuse connector 15) by a predetermined signal that is transmitted from the second circuit board 13 to the first circuit board 12 through the relay terminal portion 21 according to the operation of the user. When the current is supplied to the operational relays 20B, the current is supplied to the vehicle electrical components (such as various lamps, an air conditioner, a power window, a power steering, a power seat, a horn, a wiper, a defroster, and a seat heater) which are to be controlled by the operational relays 20B. Due to the supplied current, heat is generated on the operational electrical components and the circuit boards 12, 13. The amount of the generated heat is likely to be proportional to an accumulated time and the amount of supplied current.

At this time, if the heat of the operational electrical components (the operational relay 20B, the connector 14, and the fuse connector 15) is transmitted to the relay case 20a of the start relay 20A that is the start electrical component, a temperature of the relay case 20a increases. Particularly, since the start relays 20A included in the second start relay group 23 are disposed between the first circuit board 12 and the second circuit board 13, the relay case 20a does not have high heat dissipation. Accordingly, if the heat generated on the operation electrical components during the operation of the vehicle is transmitted to the relay case 20a, the heat is likely to be accumulated on the relay case 20a. On the other hand, if the engine is shut down in a low temperature and high humidity environment to stop the operation of the vehicle, the decrease in the temperature is easily facilitated, because the terminal portions 20b each having the fixed contact FC and the movable contact MC of the start relay 20A are made of metal material that has higher thermal conductivity than the resin material constituting the relay case 20a and are connected to the circuit pattern of the first circuit board 12 made of metal material, and heat sink effect occurs at a low temperature. In this configuration, the temperature of the relay case 20a becomes relatively high, and the temperature of the terminal portions 20b having the fixed contact FC and the movable contact MC become relatively low. Accordingly, a difference in the temperature between the relay case 20a and the terminal portions 20b is likely to be large. Particularly, the fixed contact terminal portion 20b2 having the fixed contact FC is likely to have a lower temperature than the movable contact terminal portion 20b3 having the movable contact MC, because the movable contact terminal portion 20b3 includes the magnetic member 20d that is to be in contact with the coil 20c and is likely to have a higher temperature due to the heat transmitted from the coil 20c. In the relay case 20a, the vaporized moisture may exist due to the heat caused by the supply of the current. In such a case, if the large difference in the temperature occurs between the fixed contact terminal portion 20b2 having the fixed contact FC and the relay case 20a, the condensation is likely to selectively occur on the fixed contact FC of the fixed contact terminal portion 20b2. The condensation may be frozen in a low temperature environment. If the condensation is frozen, the fixed contact FC and the movable contact MC of the terminal portions 20b cannot be in contact with each other when the operation of the vehicle is tried to be restarted, which may result in a malfunction of the start relay 20A. Thus, the vehicle is not likely to be started, for example, because the engine is not started.

As illustrated in FIG. 4 to FIG. 6, according to this embodiment, since the surrounding heat shield walls 24 are disposed between the start relays 20A included in the first start relay group 22 and the operational electrical components (the operational relay 20B, the connector 14, and the fuse connector 15), the heat generated on the operational electrical components during the operation of the vehicle is hardly transmitted to the relay cases 20a of the start relays 20A included in the first start relay group 22, and thus the temperature of each relay case 20a is less likely to increase. Accordingly, even if the operation of the vehicle is stopped in the low temperature and high humidity environment, a difference in the temperature between the relay case 20a of each start relay 20A included in the first start relay group 22 and the fixed contact terminal portion 20b2 having the fixed contact FC can be made smaller. Particularly, since the surrounding heat shield walls 24 each have the substantially rectangular tubular shape with a bottom that opens toward the first circuit board 12 and individually surround each of the start relays 20A, the start relays 20A are hardly exposed to the operational electrical component side, and thus high heat shield effect can be obtained and the temperature difference can be made smaller. In addition, since the start relays 20A included in the first start relay group 22 include the start relays 20A that are disposed on the outer end portion of the casing 11 and disposed more exterior than the operational electrical component, and further includes the start relay 20A that is disposed at the corner of the outer end portion of the casing 11, the heat of the relay case 20a of the start relay 20A can be released to the outside of the casing 11, and thus the decrease in the temperature of the relay case 20a in the low temperature environment can be facilitated and the difference in the temperature can be made smaller. As described above, the condensation and the freezing of the moisture in the relay case 20a of the start relay 20A included in the first start relay group 22 hardly occur at the fixed contact FC of the fixed contact terminal portion 20b2. Thus, a situation in which the current is not supplied to the start relay 20A at the start of the vehicle can be avoided.

Further, according to the present embodiment, as illustrated in FIG. 4 and FIG. 6, since the partition heat shield wall 28 is disposed between the start relays 20A included in the second start relay group 23 and the operational electrical components, the heat generated on the operational electrical components during the operation of the vehicle is hardly transmitted to the relay cases 20 of the start relays 20A included in the second start relay group 23, and thus the temperature of the relay case 20*a* is less likely to increase. Accordingly, even if the operation of the vehicle is stopped in the low temperature and high humidity environment, the difference in the temperature between the relay case 20*a* of the start relay 20A included in the second start relay group 23 and the fixed contact terminal portion 20*b*2 having the fixed contact FC can be made smaller. Particularly, the partition heat shield wall 28 divides the space between the first circuit board 12 and the second circuit board 13 into the first space S1 on the outer side and the second space S2 on the inner side. In the first space S1, the start relays 20A included in the second start relay group 23 are disposed. In the second space S2, the operational relays 20B that are the operational electrical components are disposed. With this configuration, the heat can be easily diffused from the relay case 20*a* of the start relays 20A included in the second start relay group 23 that is disposed in the first space S1 to the outside, and thus the increase in the temperature can be made smaller. Further, since the partition heat shield wall 28 allows the first space S1 to open toward the outside of the casing 11 except for the second space S2 side, i.e., in three directions, the heat can be easily diffused from the relay cases 20 of the start relays 20A included in the second start relay group 23 to the outside. In addition, the first space S1 includes the outer end portion of the casing 11 and further the corners of the outer end portion, and the start relays 20A included in the second start relay group 23 are disposed on the outer end portion and the corner. With this configuration, the heat generated on the relay case 20*a* can be further easily diffused to the outside. With the above configuration, the condensation and the freezing of the moisture in the relay case 20*a* of the start relay 20A included in the second start relay group 23 hardly occur on the fixed contact FC of the fixed contact terminal portion 20*b*2, and thus the a situation in which the current is not supplied to the start relay 20A at the start of the vehicle can be avoided.

As described above, the electrical junction box 10 according to the present embodiment includes the casing 11 configured to be mounted in a vehicle, the start relay (the start electrical component) 20A housed in the casing 11 and to which a current is supplied at least at a start of the vehicle, the operational electrical component (the operational relay 20B, the connector 14, and the fuse connector 15) housed in the casing 11 and to which the current is supplied at least during the operation of the vehicle, and the surrounding heat shield wall (the heat shield wall) 24 disposed between the start relay 20A and at least one of the operational relay 20B, the connector 14, and the fuse connector 15 that are the operational electrical component. The start relay 20A includes the relay case (the electrical component case) 20*a* and the terminal portion 20*b* (the fixed contact point terminal portion 20*b*2) housed in the relay case 20*a* and having the fixed contact FC.

In this configuration, at the start of the vehicle, the operation of the vehicle is started by the current supplied to the start relay 20A that is housed in the casing 11, and during the operation, the current is supplied to at least one of the operational relay 20B, the connector 14, and the fuse connector 15 that are the operational electrical components housed in the casing 11. Thus, during the operation of the vehicle, heat is generated on at least one of the operational relay 20B, the connector 14, and the fuse connector 15 that are the operational electrical components due to the supply of the current. At this time, if the heat is transmitted from at least one of the operational relay 20B, the connector 14, and the fuse connector 15 that are the operational electrical components to the relay case 20*a* of the start relay 20A, the relay case 20*a* of the start relay 20A has a temperature higher than that of the terminal portion 20*b* having the fixed contact FC, and thus a large difference in the temperature occurs. Accordingly, the condensation and the freezing of the moisture in the relay case 20*a* are likely to occur on the fixed contact FC, which may result in the malfunction of the start relay 20A.

In this embodiment, since the surrounding heat shield wall 24 is disposed between the start relay 20A and at least one of the operational relay 20B, the connector 14, and the fuse connector 15 that are the operational electrical components, the heat generated on at least one of the operational relay 20B, the connector 14, and the fuse connector 15 that are the operational electrical components is hardly transmitted to the relay case 20*a* of the start relay 20A, and thus the temperature of the relay case 20*a* is less likely to increase. Accordingly, even if the operation of the vehicle is stopped in a low temperature environment, the difference is less likely to occur in the temperature between the relay case 20*a* of the start relay 20A and the terminal portion 20*b* having the fixed contact FC. Thus, the condensation and the freezing of the moisture in the relay case 20*a* hardly occur on the fixed contact FC, and thus the situation in which the current cannot be supplied to the start relay 20A at the restart of the vehicle can be avoided.

The start relay 20A is not limited to one to which the current is supplied only at the start of the vehicle, but may be one to which the current is supplied during the operation of the vehicle and when the operation of the vehicle is stopped in addition to at the start of the vehicle. The operational relay 20B, the connector 14, and the fuse connector 15 that are the operational electrical components are not limited to one to which the current is always supplied during the operation of the vehicle, but may be one to which the current is supplied and no current is supplied during the operation of the vehicle (for example, to which the current is usually supplied and temporarily not supplied, or to which the current is usually not supplied and temporarily supplied). In addition, at least one of the operational relay 20B, the connector 14, and the fuse connecting portion 15 that are the operational electrical components is not limited to one to which the current is supplied only during the operation of the vehicle, but may be one to which the current is supplied during the operation of the vehicle and when the operation of the vehicle is stopped.

Further, the casing 11 houses the first circuit board (the circuit board) 12 on which the start relay 20A and at least one of the operational relay 20B, the connector 14, and the fuse connector 15 that are the operational electrical components are mounted. The first circuit board (the circuit board) 12 has the circuit pattern connected to the terminal portion 20*b*. In this configuration, the terminal portion 20*b* having the fixed contact FC of the start relay 20A is connected to the circuit pattern formed on the first circuit board 12. Accordingly, a decrease in the temperature of the terminal portion 20*b* is likely to be facilitated by the circuit pattern in a low temperature environment, but the condensation and the freezing hardly occur on the fixed contact FC, because the temperature of the relay case 20*a* is less likely to increase and the difference in the temperature between the relay case 20 and the terminal portion 20*b* having the fixed contact FC is made smaller by the surrounding heat shield wall 24 as described above.

Further, the surrounding heat shield wall 24 has the tubular shape having the bottom and the opening that opens toward the first circuit board 12, and surrounds the start relay 20A. With this configuration, since the start relay 20A is disposed in the space defined by the first circuit board 12 and the surrounding heat shield wall 24, which has the tubular shape with the bottom and the opening that opens toward the first circuit board 12, the start relay 20A is hardly exposed, or exposed only a little, to a side of at least one of the operational relay 20B, the connector 14, and the fuse connector 15 that are the operational electrical components. With this configuration, the heat from at least one of the operational relay 20B, the connector 14, and the fuse connector 15 that are the operational electrical components is further hardly transmitted to the relay case 20a of the start relay 20A, and thus the temperature of the relay case 20a is less likely to increase.

Further, on the first circuit board 12, multiple start relays 20A are mounted and the surrounding heat shield walls 24 are each arranged to surround each of the start relays 20A. With this configuration, higher heat shield can be obtained, compared to a surrounding heat shield wall that collectively surrounds the multiple start relays 20A.

Further, the surrounding heat shield walls 24 are located adjacent to each other, and the surrounding heat shield wall connecting member 25 is provided to connect the adjacent surrounding heat shield walls 24. With this configuration, the strength of each surrounding heat shield wall 24 can be maintained high by the surrounding heat shield wall connecting member 25.

Further, the start relay 20A is disposed more exterior than at least one of the operational relay 20B, the connector 14, and the fuse connector 15 that are the operational electrical components, in the casing 11. With this configuration, the decrease in the temperature of the relay case 20a of the start relay 20A in the low temperature environment can be facilitated, because the heat can be easily released to the outside at the outer side in the casing 11 compared to at the inner side. Accordingly, the difference in the temperature between the relay case 20a and the terminal portion 20b having the fixed contact FC can be further made smaller.

Further, the start relay 20A is disposed on the outer end of the casing 11. With this configuration, the decrease in the temperature of the relay case 20a in the low temperature environment can be further facilitated, and the difference in the temperature between the relay case 20a and the terminal portion 20b having the fixed contact FC can be further made smaller, because the start relay 20A is disposed on the outer end of the casing 11 where the heat can be particularly easily released to the outside.

Further, the surrounding heat shield wall 24 is integrally formed with the casing 11. This is preferred for the reason that the production cost can be reduced, e.g., the number of steps for assembling can be reduced, compared to the case in which a heat shield wall is a separate member from the casing 11.

Further, in the casing 11, the connector 14 is disposed at a position adjacent to the surrounding heat shield wall 24, and the connector/heat shield wall connecting member 26 is provided to connect the surrounding heat shield wall 24 and the connector 14, which are adjacent to each other. With this configuration, the strength of the surrounding heat shield wall 24 and the connector 14 can be maintained high by the connector/heat shield wall connecting member 26.

Further, the start electrical component is the start relay 20A, and the contact of the terminal portion 20b at least has the fixed contact FC and the movable contact MC, which is movable toward or away from the fixed contact FC. With this configuration, due to the surrounding heat shield wall 24, the condensation and the freezing of the moisture in the relay case 20a hardly occur on the fixed contact FC of the terminal portion 20b. Accordingly, at the restart of the vehicle, the movable contact MC properly comes in contact with the fixed contact FC, and the start relay 20A can properly exhibit its switching function.

As described above, the electrical junction box 10 of this embodiment includes the casing 11 configured to be mounted on the vehicle, the start relay (the start electrical component) 20A that includes the relay case (the electrical component case) 20a and the terminal portion 20b (the fixed contact terminal portion 20b2) that is housed in the relay case 20a and has the fixed contact FC, the operational electrical component (the operational relay 20B, the connector 14, and the fuse connector 15) that is housed in the casing 11 and to which the current is supplied at least during the operation of the vehicle, the first circuit board (the circuit board) 12 on which the start relay 20A and at least one of the operational relay 20B, the connector 14, and the fuse connector 15 that are the operational electrical components are mounted and has the circuit pattern connected to the terminal portion 20b, the second circuit board (the plate member) 13 that is arranged such that at least the start relay 20A is disposed between the first circuit board 12 and the second circuit board 13, and the partition heat shield wall (the heat shield wall) 28 that is disposed between the start relay 20A and at least one of the operational relay 20B, the connector 14, and the fuse connector 15 that are the operational electrical components.

In this configuration, at the start of the vehicle, the operation of the vehicle is started by the current supplied to the start relay 20A that is housed in the casing 11, and during the operation, the current is supplied to at least one of the operational relay 20B, the connector 14, and the fuse connector 15 that are the operational electrical components housed in the casing 11. Thus, during the operation of the vehicle, heat is generated on at least one of the operational relay 20B, the connector 14, and the fuse connector 15 that are the operational electrical components, due to the supply of the current. At this time, if the heat is transmitted from at least one of the operational relay 20B, the connector 14, and the fuse connector 15 that are the operational electrical components to the relay case 20a of the start relay 20A, the temperature of the relay case 20a increases. Particularly, since the start relay 20A is disposed between the first circuit board 12 and the second circuit board 13, the relay case 20a does not have high heat dissipation. If the heat is transmitted from at least one of the operational relay 20B, the connector 14, and the fuse connector 15 that are the operational electrical components to the relay case 20a, the heat is likely to be accumulated on the relay case 20a. If the operation of the vehicle is stopped in the low temperature environment, the difference in the temperature between the relay case 20a of the start relay 20A and the terminal portion 20b having the fixed contact FC is likely to be made large, because the terminal portion 20b of the start relay 20A that is connected to the circuit pattern of the first circuit board 12 is more easily cooled than the relay case 20a. Accordingly, the condensation and the freezing of the moisture in the relay case 20a are likely to occur on the fixed contact FC, which may result in a malfunction of the start relay 20A.

In this embodiment, since the partition heat shield wall 28 is disposed between the start relay 20A and at least one of the operational relay 20B, the connector 14, and the fuse connector 15 that are the operational electrical components, the heat generated on at least one of the operational relay 20B, the connector 14, and the fuse connector 15 that are the operational electrical components during the operation of the vehicle is hardly transmitted to the relay case 20a of the start relay 20A, and thus the temperature of the relay case 20a is less likely to increase. Accordingly, even if the operation of the vehicle is stopped in the low temperature environment, the difference in the temperature between the relay case 20*a* of the start relay 20A and the terminal portion 20*b* having the fixed contact FC can be made smaller. Thus, the condensation and the freezing of the moisture in the relay case 20*a* hardly occur on the fixed contact FC, and the situation in which the current is not supplied to the start relay 20A at the restart of the vehicle can be avoided.

The partition heat shield wall 28 divides the space between the first circuit board 12 and the second circuit board 13 into the first space S1 on the outer side and the second space S2 on the inner side of the casing 11, and the start relay 20A is disposed in the first space S1 and at least one of the operational relay 20B, the connector 14, and the fuse connector 15 that are the operational electrical components is disposed in the second space S2. In this configuration, the decrease in the temperature of the relay case 20*a* of the start relay 20A at a time when the operation of the vehicle is stopped in the low temperature environment can be facilitated by such an arrangement of the start relay 20A in the first space S1, because the heat in the first space S1 on the outer side of the casing 11 can be easily released to the outside compared to the second space S2 on the inner side. In addition, the difference in the temperature between the relay case 20*a* and the terminal portion 20*b* having the fixed contact FC can be made smaller, because the heat from at least one of the operational relay 20B, the connector 14, and the fuse connector 15 that are the operational electrical components, is hardly transmitted to the relay case 20*a* of the start relay 20A due to the partition heat shield wall 28 that divides the space into the first space S1 on the outer side and the second space S2 on the inner side.

Further, the partition heat shield wall 28 has the configuration that allows the first space S1 to open at least toward the side opposite to the second space S2 side. With this configuration, the heat can be easily released from the first space S1 to the outside compared to the case in which a partition heat shield wall surrounds the first space S1, because the first space S1 opens to the side opposite to the second space S2, i.e., opens to the outside of the casing 11. Accordingly, the decrease in the temperature of the relay case 20*a* of the start relay 20A in the low temperature environment is further facilitated, and thus the difference in the temperature between the relay case 20*a* and the terminal portion 20*b* having the fixed contact FC can be further made smaller.

Further, the partition heat shield wall 28 has the configuration that allows the first space S1 to open in the direction intersecting with the arrangement direction of the first space S1 and the second space S2. With this configuration, the first space S1 can open to a larger area, and thus the heat can further easily be released from the first space S1 to the outside. Accordingly, the decrease in the temperature of the relay case 20*a* of the start relay 20A in the low temperature environment can be further facilitated.

Further, the first space S1 defined by the partition heat shield wall 28 includes the outer end portion of the casing 11, and the start relay 20A is disposed on the outer end portion. With this configuration, the decrease in the temperature of the relay case 20*a* in the low temperature environment can be further facilitated, and the difference in the temperature between the relay case 20*a* and the terminal portion 20*b* having the fixed contact FC can be further made smaller, because the first space S1 includes the outer end portion and the start relay 20A is disposed on the outer end portion where the heat can be particularly easily released to the outside.

Further, the first space S1 defined by the partition heat shield wall 28 includes the corner of the casing 11, and the start relay 20A is disposed at the corner. With this configuration, the decrease in the temperature of the relay case 20*a* can be further facilitated, because the first space S1 includes the corner and the start relay 20A is disposed at the corner where, among the outer end portion in the casing, the heat can be particularly easily released to the outside.

Further, the plate member is the second circuit board 13 having the circuit pattern connected to the circuit pattern of the first circuit board 12. In this configuration, since the heat is generated on the second circuit board 13 due to the supply of the current to the circuit pattern thereof, the heat may be transmitted to the relay case 20*a* of the start relay 20A that is disposed between the second circuit board 13 and the first circuit board 12 and the difference in the temperature between the relay case 20*a* and the terminal portion 20*b* may be made large. Even in such a case, as described above, the difference in the temperature between the relay case 20*a* and the terminal portion 20*b* having the fixed contact FC is made smaller, because the temperature of the relay case 20*a* is less likely to increase due to the partition heat shield wall 28. Accordingly, the condensation and the freezing hardly occur on the fixed contact FC.

Further, the relay terminal portion 21 through which the first circuit board 12 and the second circuit board 13 are connected to each other is provided, and the partition heat shield wall 28 has the surface that extends along the relay terminal portion 21. With this configuration, the relay terminal portion 21 can be guided by the surface of the partition heat shield wall 28 during the connection operation, and thus the assemble workability can be improved.

Further, the partition heat shield wall 28 has the bent shape in the cross section taken along the plate surface of the first circuit board 12. In this configuration in which the partition heat shield wall 28 has the bent shape, the mechanical strength thereof can be maintained high, and the partition heat shield wall 28 is hardly improperly deformed. Thus, the partition heat shield wall 28 hardly comes in contact with the start relay 20A or at least one of the operational relay 20B, the connector 14, and the fuse connector 15 that are the operational electrical components.

Further, the horizontal reinforcing rib (the reinforcing rib) 30 that connects the surfaces of the bend portions having the bent shape is disposed on the partition heat shield wall 28. With this configuration, the mechanical strength of the partition heat shield wall 28 can be further improved.

Further, the vertical reinforcing rib (the reinforcing member) 29 that extends along the plate surface of the first circuit board 12 and the surface of the partition heat shield wall 28 is provided. With this configuration, the mechanical strength of the partition heat shield wall 28 can be further improved by the vertical reinforcing rib 29, and the partition heat shield wall 28 is hardly improperly deformed. Accordingly, the partition heat shield wall 28 hardly comes in contact with at least one of the operational relay 20B, the connector 14, and the fuse connector 15 that are the operational electrical components.

Further, the start electrical component is the start relay 20A, and the contact of the terminal portion 20*b* at least has the fixed contact FC and the movable contact MC that is movable toward or away from the fixed contact FC. With this configuration, the condensation and the freezing of the moisture in the relay case 20*a* hardly occur on the fixed contact FC included in the terminal portion 20*b* due to the above-described surrounding heat shield wall 24, and thus the movable contact FC can properly contact with the fixed contact FC at the restart of the vehicle. Accordingly, the start relay 20A can properly exhibit its switching function.

Second Embodiment

A second embodiment of the present invention will be described with reference to FIG. 8 or FIG. 9. In the second embodiment, a surrounding heat shield wall 124 has a different shape. Similar configurations, operations, and effects to those of the first embodiment will not be described.

Figure 8:
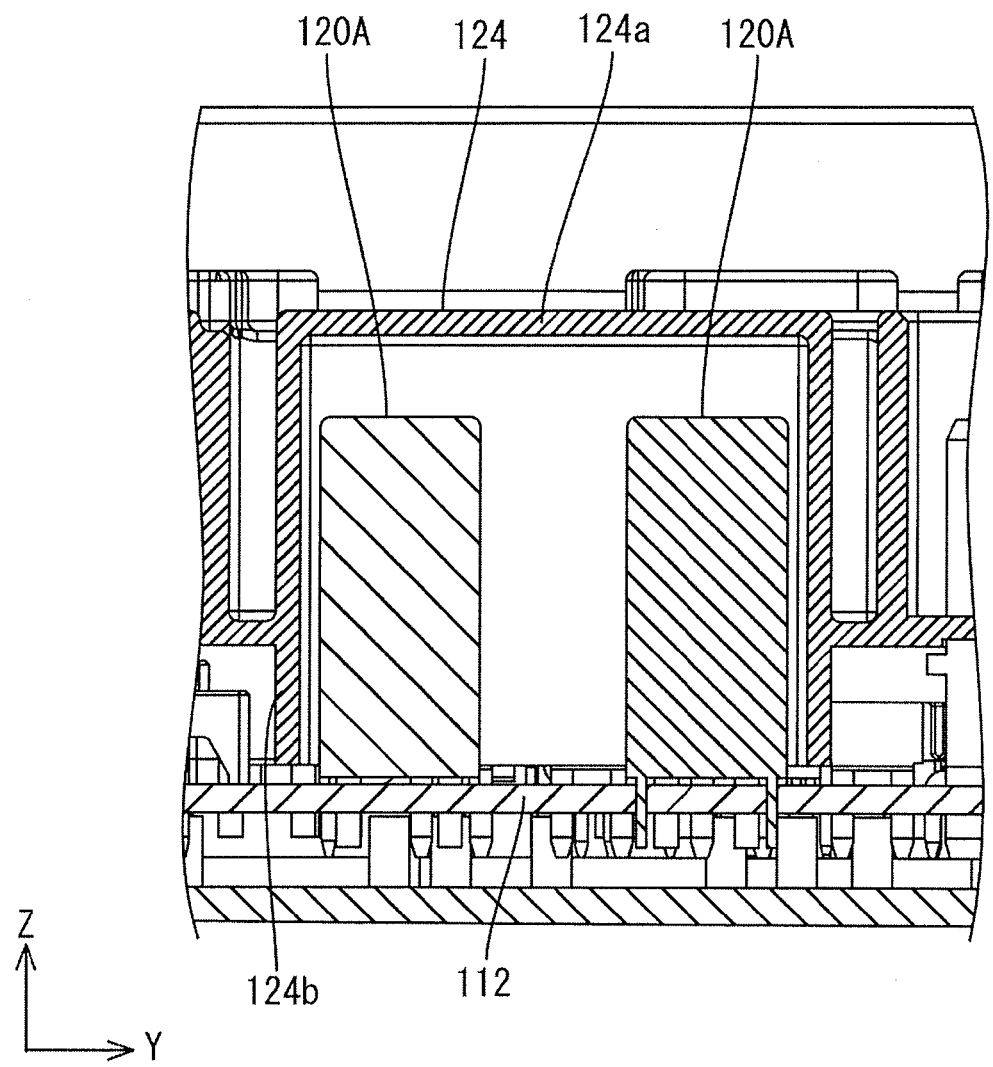
FIG. 8 is a magnified cross-sectional view of an electrical junction box of a second embodiment according to the present invention.
Figure 9:
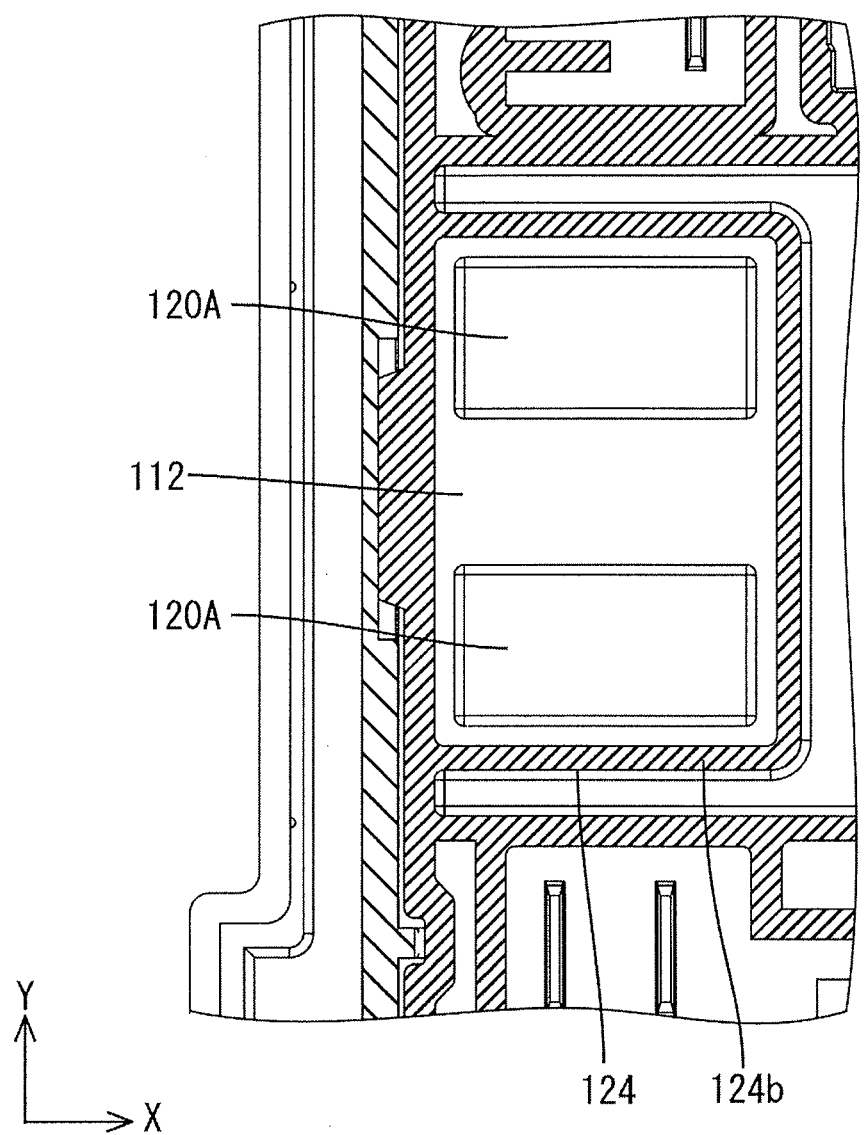
FIG. 9 is a magnified top cross-sectional view of the electrical junction box.

As illustrated in FIG. 8 and FIG. 9, the surrounding heat shield wall 124 according to this embodiment collectively surrounds the start relays 120A (collective surrounding type). The start relays 120A are housed in a pace defined by the surrounding heat shield wall 124 and a first circuit board 112. Specifically, the surrounding heat shield wall 124 has a substantially rectangular tubular shape with a bottom and has a size sufficiently surrounding two start relays 120A adjacent to each other on the first circuit board 112. The surrounding heat shield wall 124 includes a ceiling wall 124a that is located over two start relays 120A in a plan view and a side wall 124b that extends from an outer edge of the ceiling wall 124a toward the first circuit board 112 and surrounds an outer surfaces of the start relays 120A except for the outer surfaces that face each other. The adjacent two start relays 120A are housed in a common space that is defined by the surrounding heat shield wall 124 and the first circuit board 112. The surrounding heat shield wall 124 having such a configuration can sufficiently block the heat from the operational electrical components, and thus the heat is hardly transmitted to the start relay 120A.

Third Embodiment

Figure 10:
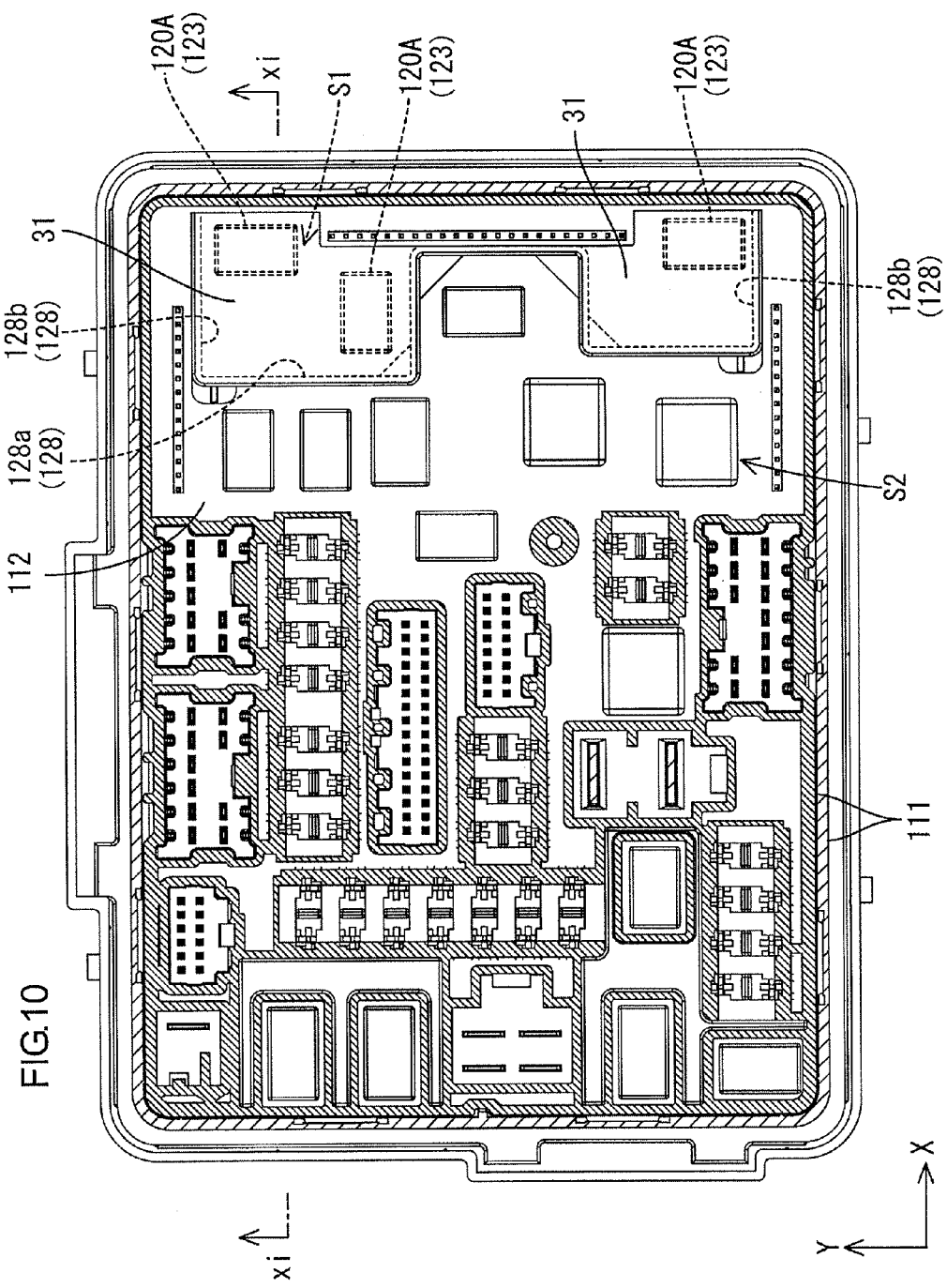
FIG. 10 is a top cross-sectional view of an electrical junction box of a third embodiment according to the present invention.

A third embodiment of the present invention will be described with reference to FIG. 10 or FIG. 11. In the third embodiment, a second heat shield wall 31 is provided and a partition heat shield wall 128 has a different shape. Similar configurations, operations, and effects to those of the first embodiment will not be described.

Figure 11:
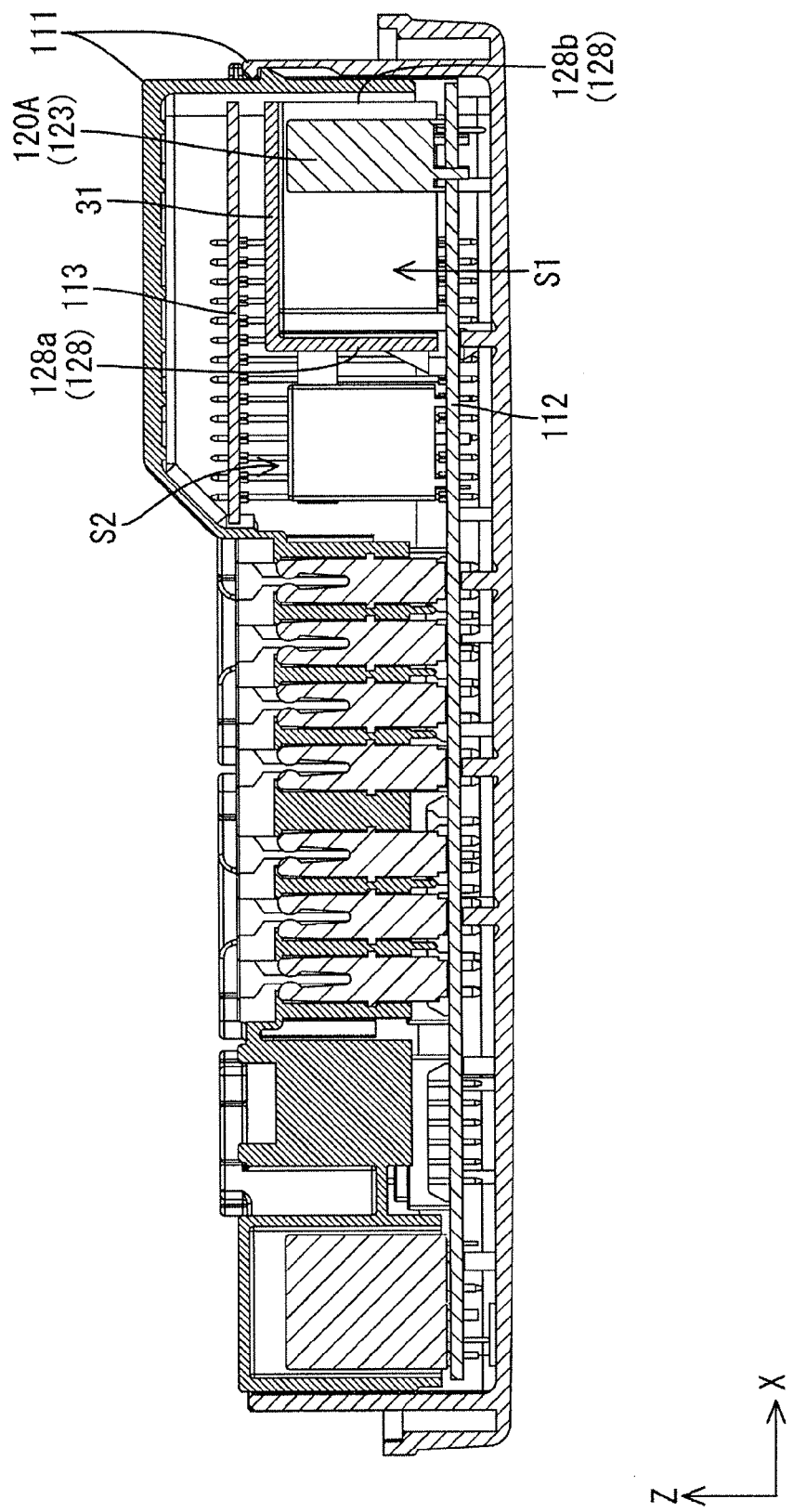
FIG. 11 is a cross-sectional view taken along a line xi-xi in FIG. 10.

As illustrated in FIG. 11, the second heat shield wall 31 is disposed between the second circuit board 113 and start relays 120A included in a second start relay group 123 that is disposed in the first space S1 defined by the circuit boards 112, 113. The second heat shield wall 31 is connected to the partition heat shield wall 128 and extends from the top end of the partition heat wall 128, which extends upward from the first circuit board 112, toward the outside of a casing 111 to have eaves like shape. The partition heat shield wall 128 and the second heat shield wall 31 form a substantially L-shape in a cross section in the X-axis direction and the Z-axis direction. As illustrated in FIG. 10, two second heat shield walls 31 are disposed with a meandered section of the partition heat shield wall 128, which is formed at a middle of the first circuit board 112 in the short-side direction (the Y-axis direction), therebetween in the Y-axis direction. Each of the second heat shield walls 31 extends over an area that covers the entire area of the start relays 120A included in the second start relay group 123 in a plan view. The partition heat shield wall 128 includes, in addition to a main wall 128a that extends across the first circuit board 112 in the short-side direction thereof and has the meandered section at its middle, a pair of side walls 128b that extends from each end of the main wall 128a toward the outside of the casing 111 along the long-side (the X-axis direction) of the first circuit board 112. In other words, the partition heat shield wall 128 has a configuration that allows the first space S1 to open toward only one side that is opposite to a side of the second space S2. The second heat shield wall 31 is connected to each of the side walls 128b of the partition heat shield wall 128, and thus higher mechanical strength can be obtained. The partition heat shield wall 128 and the second heat shield wall 31 define a pouch-like shape that opens toward the outside of the casing 111 along the X-axis direction.

With the above configuration, even if heat is generated at the circuit pattern of the second circuit board 113 and the mounted electrical components when the current is supplied, since the second heat shield wall 31 is disposed between the second circuit board 113 and the start relays 120A included in the second start relay group 123 and covers the entire area of the start relays 120A in a plan view, the heat is hardly transmitted from the second circuit board 113 side to the start relay 120A included in the second start relay group 123.

As described above, according to this embodiment, the second heat shield wall 31 is disposed between the start relay (the start electrical component) 120A and the second circuit board 113. With this configuration, the second heat shield wall 31 blocks the heat from the second circuit board 113, and thus the heat is hardly transmitted to the start relay 120A. Accordingly, a temperature of the relay case 20a is further less likely to increase, and thus a difference in the temperature between the relay case 10a and the terminal portion 20b having the fixed contact FC can be made smaller (see FIG. 7).

Further, the partition heat shield wall 128 and the second heat shield wall 31 are continuous from each other. With this configuration, the mechanical strength can be improved in addition to the high heat shield effect.

Fourth Embodiment

A fourth embodiment of the present invention will be described with reference to FIG. 12. In the fourth embodiment, a relay 220 has a different shape. Similar configurations, operations, and effects to those of the first embodiment will not be described.

Figure 12:
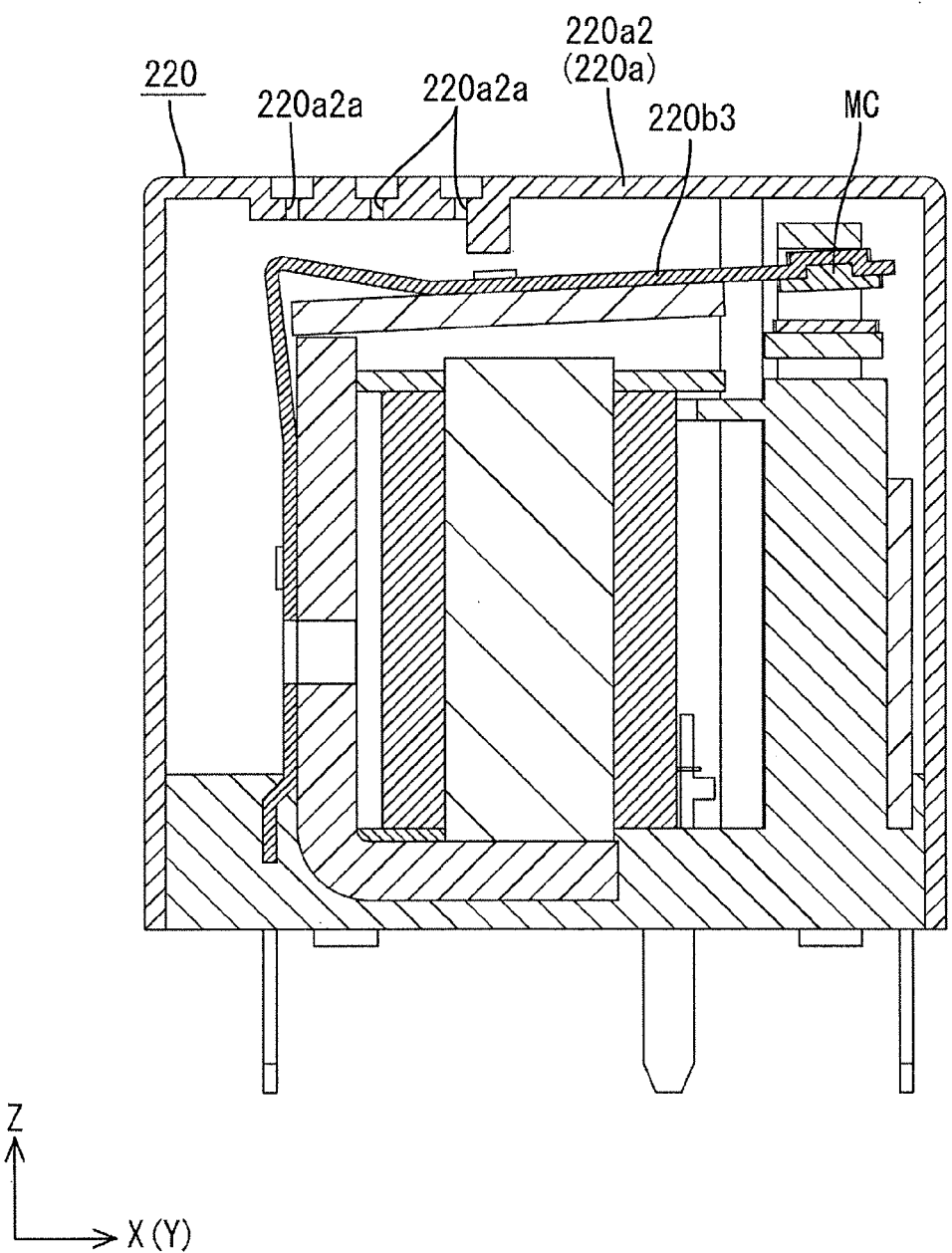
FIG. 12 is a side cross-sectional view illustrating a schematic configuration of a relay of a fourth embodiment according to the present invention.

As illustrated in FIG. 12, a cover 220a2 included in a relay case 220a has fewer ventilation holes 220a2a than that in the first embodiment. A ceiling of the cover 220a2 (a portion facing a movable portion of a movable contact terminal portion 220b3, which will be described later) includes three ventilation holes 220a2a that are located beside one another. Three ventilation holes 220a2a are located closer to a base end (an end opposite to the side of the free end having the movable contact MC) side of the movable portion, which has a cantilever shape, of the movable contact terminal portion 220b3.

Other Embodiments

The present invention is not limited to the embodiments described in the above description with reference to the drawings. The following embodiments may be included in the technical scope of the present invention.

(1) In the above-described embodiments, the surrounding heat shield wall surrounds the start relay included in the first start relay group. However, according to the present invention, the surrounding heat shield wall may surround the operational electrical component adjacent to the first start relay group (specifically, at least one of the operational relay, the connector, and the fuse connecting portion). In such a case, the surrounding heat shield wall that surrounds the start relay included in the start relay group may be eliminated, or the surrounding heat shield wall may be provided for each of the start relays included in the first start relay group and the operational electrical component.

(2) In the above-described embodiment, the surrounding heat shield wall surrounds the start relay included in the first start relay group. However, the partition heat shield wall that is provided to separate the second start relay group from the operational electrical component group can be used instead of the surrounding heat shield wall in the embodiments. According to the present invention, a heat shield wall may be a partition-type heat shield wall that separates an arrangement area of the first start relay group from an arrangement area of the operational electrical component group without surrounding the start relays. In such a case, both of the above-described surrounding heat shield wall and the partition-type heat shield wall may be provided.

(3) In the above-described embodiments, the start relay included in the first start relay group is disposed more exterior than the operational electrical components in the casing. However, according to the present invention, the start relay included in the first start relay group and the operational electrical component may be disposed at positions that are away from the center of the casing by substantially the same distance. In addition, according to the present invention, the start relay included in the first start relay group may be disposed more interior than the operational electrical component in the casing.

(4) In the above-described embodiments, the start relay included in the first start relay group is disposed on the outer end in the casing. However, the start relay included in the first start relay group may be disposed more interior than the outer end. In addition, the start relay included in the first start relay group may not be disposed at the corner in the casing.

(5) In the above-described embodiments, the surrounding heat shield wall has the rectangular tubular shape with a bottom. However, the specific shape of the surrounding heat shield wall can be properly changed. For example, the shape may be a circular tubular shape with a bottom or an oval tubular shape with a bottom.

(6) In the above-described embodiments, the opening end of the surrounding heat shield wall is in contact or adjacent to the first circuit board. However, according to the present invention, the opening end of the surrounding heat shield wall may be located away from the first circuit board with a predetermined gap therebetween such that an inner space defined by the surrounding heat shield wall is communicated with the outside of the surrounding heat shield wall.

(7) In the above-described embodiments, the heat shield wall connecting member connects the adjacent surrounding heat shield walls. However, a part or the entire of the heat shield wall connecting member may be eliminated. The same will be applied to the connector/heat shield wall connecting member.

(8) In the above-described embodiments, the surrounding heat shield wall is integrally formed with the second casing member. However, the surrounding heat shield wall may be a separate member from the second casing member and the first circuit board and may be attached to the first circuit board or the second casing.

(9) The number and the position of the start relay included in the first start relay group may be properly changed from those in the above-described embodiments, and the number and the position of the surrounding heat shield wall may be changed accordingly.

(10) In the second embodiment, the surrounding heat shield wall collectively surrounds two adjacent start relays. However, according to the present invention, the surrounding heat shield wall may collectively surround three or more start relays.

(11) In the above-described embodiments, the partition heat shield wall is disposed between the start relays included in the second start relay group and the operational electrical components. However, the surrounding heat shield wall that is provided for surrounding the start relays included in the first start relay group may be used instead of the partition heat shield wall. In other words, according to the present invention, a surrounding-type heat shield wall may surround the start relays included in the second start relay group. In such a case, both of the partition heat shield wall and the surrounding-type heat shield wall may be provided. Further, when the surrounding-type heat shield wall is provided, the configuration relating to the surrounding heat shield wall that surrounds the start relays included in the first start relay group may be applied to provide the heat shield wall (the individual surrounding type) that individually surrounds the start relays included in the second start relay group, or the configuration relating to the surrounding heat shield wall described in the second embodiment may be applied to provide the heat shield wall (the collective surrounding type) that collectively surround the start relays included in the second start relay group.

(12) Other than the above (11), according to the present invention, the surrounding heat shield wall may surround the operational electrical component (specifically, at least one of the operational relay, the connector, and the fuse connecting portion) adjacent to the second start relay group. In such a case, the surrounding heat shield wall that surrounds the start relays included in the second start relay group may be eliminated, or the surrounding heat shield wall may be provided for both of the start relays included in the second start relay group and the operational electrical components.

(13) In the above-described embodiments, the partition heat shield wall has a configuration that allows the first space to open at least toward a side opposite to the second space. However, the partition heat shield wall may allow the first space to open in a direction that intersects with the arrangement direction of the first space and the second space, but may not allow the first space to open in the side opposite to the second space.

(14) In the above-described embodiments, the partition heat shield wall is attached to the first circuit board. However, according to the present invention, the partition heat shield wall may be attached to the second circuit board.

(15) In the above-described embodiments, the operational relay that is the operational electrical component is disposed between the first circuit board and the second circuit board (in the second space). However, only the start relay may be disposed between the first circuit board and the second circuit board, and no operational relay may be disposed between the first circuit board and the second circuit board.

(16) In the above-described embodiments, the operational relay that is the operational electrical component is disposed between the first circuit board and the second circuit board (in the second space). However, the operational electrical components other than the operational relay (for example, the connector and the fuse connecting portion) may be disposed between the first circuit board and the second circuit board.

(17) In the above-described embodiments, the start relay included in the second start relay group is disposed more exterior than the operational electrical components in the casing. However, according to the present invention, the start relay included in the second start relay group and the operational electrical component may be disposed at positions that are away from the center of the casing by substantially the same distance. In addition, according to the present invention, the start relay included in the second start relay group may be disposed more interior than the operational electrical component in the casing.

(18) In the above-described embodiments, the start relay included in the second start relay group is disposed on the outer end in the casing. However, the start relay included in the second start relay group may be disposed more interior than the outer end in the casing. Further, the start relay included in the second start relay group may not be disposed at the corner in the casing.

(19) In the above-described embodiments, the partition heat shield wall extends across a substantially entire width of the first circuit board. However, the partition heat shield wall may be disposed on a part of the first circuit board. In such a case, multiple partition heat shield walls (e.g., in the number same as the number of start relays included in the second start relay group) may be provided.

(20) In the above-described embodiments, the partition heat shield wall has the bent shape in the cross section taken along the plate surface of the first circuit board. However, according to the present invention, the partition heat shield wall may extend straightly across the first circuit board.

(21) In the above-described embodiments, the horizontal reinforcing rib that connects the surfaces of the bend portions of the heat shield wall is provided. However, a part or the entire of the horizontal reinforcing rib may be eliminated. The same may be applied to the vertical reinforcing rib.

(22) In the above-described embodiments, the partition heat shield wall has the surface that extends along the relay terminal portion and can contact with the relay terminal portion. However, the surface of the partition heat shield wall may be away from the relay terminal portion and cannot be in contact with the relay terminal portion.

(23) In the above-described embodiments, the second circuit board having the circuit pattern is arranged so as to have the start relay included in the second start relay group between the second circuit board and the first circuit board. However, a plate member having no circuit pattern may be arranged instead of the second circuit board.

(24) The number and the position of the start relay included in the second start relay group is properly changed from those in the above-described embodiments, and the number and the position of the partition heat shield wall may be changed accordingly.

(25) The electrical junction box described in the above-described embodiments may be mounted in the vehicle such that one of the X-axis direction, the Y-axis direction, and the Z-axis direction in the drawings corresponds to the vertical direction or the horizontal direction. In addition, the electrical junction box may be mounted in the vehicle such that one of the X-axis direction, the Y-axis direction, and the Z-axis direction in the drawings tilts relative to the vertical direction or the horizontal direction.

(26) In the above-described embodiments, the relay is exemplified as the start electrical component. However, according to the present invention, other than the relay, a contact type electrical component having a terminal portion with a contact may be used as the start electrical component. Further, the contact structure of the relay used as the start electrical component or the operational electrical component may be a form B contact structure or a form C contact structure other than the form A contact structure.

(27) In the above-described embodiments, the relay has a configuration in which the fixed contact terminal portion having no magnetic member is likely to have a low temperature compared to the movable contact terminal portion having the magnetic member to be in contact with the coil. However, the present invention may be applied to a relay in which the movable contact terminal portion and the fixed contact terminal portion are likely to have substantially the same temperature due to the influence of the outside environment, for example. In such a case, the condensation and the freezing hardly occur at both of the movable contact and the fixed contact. Further, the present invention may be applied to a relay in which the movable contact terminal portion is likely to have a lower temperature than the fixed contact terminal portion due to the influence of the outside environment, for example. In such a case, the condensation and the freezing hardly occur at the movable contact.

(28) In the above-described third embodiment, the surrounding heat shield wall collectively surrounds the adjacent two start relays. According to the present invention, the surrounding heat shield wall may collectively surround three or more start relays.

EXPLANATION OF SYMBOLS 11, 111: casing, 12, 112: first circuit board (circuit board), 13, 113: second circuit board (plate member), 14: connector (operational electrical component), 15: fuse connector (operational electrical component), 20, 220: relay (start electrical component, operational electrical component), 20A, 120A: start relay (start electrical component), 20B: operational relay (operational electrical component), 20a, 220a: relay case (electrical component case), 20b: terminal portion, 21: relay terminal portion, 24, 124: surrounding heat shield wall (heat shield wall), 25: heat shield wall connecting member, 26: connector/heat shield wall connecting member, 28, 128: partition heat shield wall (heat shield wall), 29: vertical reinforcing rib (reinforcing member), 30: horizontal reinforcing rib (reinforcing rib), 31: second heat shield wall, FC: fixed contact (contact), MC: movable contact (contact), S1: first space, S2: second space

The invention claimed is:
1. An electrical junction box to be installed in a vehicle, the electrical junction box comprising:
a start electrical component to which a current is supplied by a power source at least at a start of the vehicle for controlling supply of current to a vehicle electrical component for starting the vehicle, the start electrical component including:
a terminal including a contact; and
an electrical component case holding the terminal therein;
an operational electrical component to which a current is supplied by the power source at least during an operation of the vehicle for controlling supply of current to a functional electrical component in the vehicle;
a casing holding the start electrical component and the operation electrical component therein;
a heat shield wall disposed between the start electrical component and the operational electrical component; and
a circuit board on which the start electrical component and the operational electrical component are mounted, the circuit board has a circuit pattern connected to the terminal portion, wherein:
the start electrical component includes a plurality of start electrical components,
the heat shield wall has a tubular shape having a bottom and an opening that opens toward the circuit board, and the heat shield wall includes a plurality of heat shield walls that individually surround each of the start electrical components.

2. The electrical junction box according to claim 1, wherein the start electrical component is disposed more exterior than the operational electrical component in the casing.

3. The electrical junction box according to claim 2, wherein the start electrical component is disposed on an outer end in the casing.

4. The electrical junction box according to claim 1, wherein the heat shield wall is integrally formed with the casing.

5. The electrical junction box according to claim 4, further comprising:
- a connector at a position adjacent to the heat shield wall in the casing; and
- a connector/heat shield wall connecting member connecting the heat shield wall and the connector that are adjacent to each other.

6. An electrical junction box to be installed in a vehicle, the electrical junction box comprising:
- a start electrical component to which a current is supplied by a power source at least at a start of the vehicle for controlling supply of current to a vehicle electrical component for starting the vehicle, the start electrical component comprising:
  - a terminal including a contact; and
  - an electrical component case holding the terminal therein;
- an operational electrical component to which a current is supplied by the power source at least during an operation of the vehicle for controlling supply of current to a functional electrical component in the vehicle;
- a casing holding the start electrical component and the operation electrical component therein;
- a heat shield wall disposed between the start electrical component and the operational electrical component;
- a circuit board on which the start electrical component and the operational electrical component are mounted, the circuit board having a circuit pattern connected to the terminal portion; and
- a plate member disposed such that at least the start electrical component is disposed between the plate member and the circuit board wherein:
- the heat shield wall divides a space between the circuit board and the plate member into a first space on an outer side and a second space on an inner side of the casing, and
- the start electrical component is disposed in the first space and the operational electrical component is disposed in the second space.

7. The electrical junction box according to claim 6, wherein the heat shield wall has a configuration that allows the first space to open at least toward a side opposite to the second space.

8. The electrical junction box according to claim 7, wherein the heat shield wall has a configuration that allows the first space to open in a direction intersecting with an arrangement direction of the first space and the second space.

9. The electrical junction box according to claim 6, wherein the first space defined by the heat shield wall includes an outer end portion in the casing, and the start electrical component is disposed in the outer end portion.

10. The electrical junction box according to claim 9, further comprising a heat shield wall connecting member, wherein the heat shield walls are adjacent to each other, and the adjacent heat shield walls are connected to each other via the heat shield wall connecting member.

11. The electrical junction box according to claim 9, wherein the outer end portion includes a corner of the casing, and the start electrical component is disposed at the corner.

12. The electrical junction box according to claim 6, wherein the plate member is a second circuit board having a circuit pattern connected to the circuit pattern of the circuit board.

13. The electrical junction box according to claim 12, further comprising a second heat shield wall disposed between the start electrical component and the second circuit board.

14. The electrical junction box according to claim 13, wherein the heat shield wall and the second heat shield wall are continuous from each other.

15. The electrical junction box according to claim 12, further comprising a relay terminal portion through which the circuit board and the second circuit board are connected to each other, wherein the heat shield wall has a surface extending along the relay terminal portion.

16. The electrical junction box according to claim 6, wherein the heat shield wall has a bent shape in a cross section taken along a plate surface of the circuit board.

17. The electrical junction box according to claim 16, further comprising a reinforcing rib, the reinforcing rib connecting surfaces of the heat shield wall having the bent shape.

18. The electrical junction box according to claim 6, further comprising a reinforcing member extending along the plate surface of the circuit board and a surface of the heat shield wall.

19. The electrical junction box according to claim 1, wherein
- the start electrical component is a relay, and
- the contact of the terminal portion at least includes a fixed contact and a movable contact movable toward or away from the fixed contact.

20. The electrical junction box according to claim 6, wherein
- the start electrical component comprises a relay, and
- the contact of the terminal portion at least includes a fixed contact and a movable contact movable toward or away from the fixed contact.

* * * * *